(12) United States Patent
Iida et al.

(10) Patent No.: US 8,507,927 B2
(45) Date of Patent: Aug. 13, 2013

(54) SEMICONDUCTOR DEVICE WITH HIGH DENSITY OPTICAL CHIPS AND MANUFACTURING METHOD THEREOF

(75) Inventors: Atsuko Iida, Kanagawa (JP); Iwao Mitsuishi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 733 days.

(21) Appl. No.: 12/722,847

(22) Filed: Mar. 12, 2010

(65) Prior Publication Data

US 2010/0244059 A1  Sep. 30, 2010

(30) Foreign Application Priority Data

Mar. 30, 2009  (JP) .................................. 2009-080880

(51) Int. Cl.
*H01L 33/00* (2010.01)
(52) U.S. Cl.
USPC ................... 257/88; 257/72; 257/84; 257/93; 257/98
(58) Field of Classification Search
USPC ....................... 257/72, 79–84, 88, 93, 98–100
See application file for complete search history.

(56) References Cited

U.S. PATENT DOCUMENTS

| | | | | |
|---|---|---|---|---|
| 5,821,571 | A | * | 10/1998 | Lebby et al. .................... 257/98 |
| 6,014,313 | A | | 1/2000 | Hesselbom |
| 7,501,700 | B2 | | 3/2009 | Jeun et al. |
| 2003/0157741 | A1 | * | 8/2003 | Oohata et al. .................. 438/34 |
| 2009/0058256 | A1 | | 3/2009 | Mitsuishi et al. |
| 2009/0179317 | A1 | | 7/2009 | Iida et al. |
| 2010/0051988 | A1 | | 3/2010 | Mitsuishi et al. |

FOREIGN PATENT DOCUMENTS

| | | |
|---|---|---|
| JP | 2000-100998 | 4/2000 |
| JP | 2001-506417 | 5/2001 |
| JP | 2001-156253 | 6/2001 |
| JP | 2003-209295 | 7/2003 |
| JP | 2005-064168 | 3/2005 |
| JP | 2007-287801 | 11/2007 |

OTHER PUBLICATIONS

Japanese Notification of Reason(s) for Refusal for Japanese Application No. 2009-080880 mailed on Nov. 22, 2011.
Japanese Office Action for Application No. 2009-080880 mailed on Sep. 6, 2011.

* cited by examiner

*Primary Examiner* — Ori Nadav
(74) *Attorney, Agent, or Firm* — Turocy & Watson, LLP

(57) ABSTRACT

An aspect of the present invention provides a semiconductor device, in which densely packaging and high performance of optical elements are realized by a simple manufacturing process. The semiconductor device includes: a first chip module, a second chip module and a bonding layer. The first chip module includes a plurality of optical chips that are bonded within a substantially same plane with a first resin layer. The second chip module includes a plurality of control semiconductor chips and a plurality of connecting chips. The connecting chips include conductive materials piercing through the connecting chips. The control semiconductor chips and the connecting chips are bonded within a substantially same plane with a second resin layer. And the optical chips and the control semiconductor chips are electrically connected through the connecting chips.

5 Claims, 25 Drawing Sheets

80e

} 80

70  71

ULTRA-VIOLET RAY

A: OPTICALLY READ REGION

B: HOLLOW REGION

DICING LINE

__US 8,507,927 B2__

SEMICONDUCTOR DEVICE WITH HIGH DENSITY OPTICAL CHIPS AND MANUFACTURING METHOD THEREOF

CROSS-REFERENCE TO RELATED APPLICATION

This application is based upon and claims the benefit of priority from Japanese Patent Applications No. 2009-080880, filed on Mar. 30, 2009, the entire contents of which are incorporated herein by reference.

FIELD OF THE INVENTION

The present invention relates to a semiconductor device and a manufacturing method thereof.

BACKGROUND OF THE INVENTION

Recently, demands for multiple functions, high performance, low cost, and high packaging density of a semiconductor device are rising with the significant progress of digitalization and the spread of broadband of electronic devices such as a mobile telephone, a mobile information terminal, and digital home appliance. In such circumstances, there is required a new packaging technique of densely packaging various devices such as a logic component, a memory, a sensor, and a passive component on a substrate at low cost.

For example, desirably the semiconductor device including light emitting elements such as a Light Emitting Diode (LED) is packed along with a control element in order to reduce a luminous variation among the light emitting elements. JP 2003-209295 (KOKAI) discloses an electronic component in which the light emitting elements and the control element are integrally packed.

In the electronic component disclosed in JP 2003-209295 (KOKAI), the light emitting elements and the control element are arrayed in a pseudo-same plane when viewed from a light emitting surface side. Therefore, the packaging density of the light emitting elements is degraded. In packing components such as the control element, there is also generated a problem in that complicated processes are required in order to make via holes to establish electric connection among layers constituting the electronic component.

For the semiconductor device including the optical element such as the light emitting element, enhancement of the packaging density of the optical element leads to the improvement of characteristics. In order to further improve characteristics, desirably components such as the control element are packed through a simple process without sacrificing the packaging density of the optical element.

SUMMARY OF THE INVENTION

According to a first embodiment of the invention, a semiconductor device includes: a first chip module, a second chip module and a bonding layer configured to bond vertically the first chip module and the second chip module, wherein the first chip module includes a plurality of optical chips, the optical chips are bonded within a substantially same plane with a first resin layer interposed therebetween, each of the optical chips including an optical element, the second chip module includes a plurality of control semiconductor chips and a plurality of connecting chips, the control semiconductor chips control the optical chips, the connecting chips include conductive materials piercing through the connecting chips, the control semiconductor chips and the connecting chips being bonded within a substantially same plane with a second resin layer interposed therebetween, and the optical chips and the control semiconductor chips are electrically connected through the connecting chips.

According to a second embodiment of the invention, a semiconductor device includes: a first chip module, a second chip module and a bonding layer configured to bond vertically the first chip module and the second chip module, wherein the first chip module includes a plurality of optical chips, the optical chips are bonded within a substantially same plane with a first resin layer interposed therebetween, each of the optical chips including an optical element, the second chip module includes a plurality of heat radiation metal chips and a plurality of connecting chips, the connecting chips include conductive materials piercing through the connecting chips, the heat radiation metal chips and the connecting chips being bonded within a substantially same plane with a second resin layer interposed therebetween, and the optical chips and electrode pads are electrically connected through the connecting chips, the electrode pads being provided on an opposite side from the first chip module of the second chip module.

According to a third embodiment of the invention, a method for manufacturing a semiconductor device, includes: bonding tentatively a plurality of optical chips onto a first support substrate, each of the optical chips including an optical element; forming a first resin layer on side surfaces of the optical chips for bonding the optical chips to each other; removing the optical chips and the first resin layer from the first support substrate for forming a first chip module; bonding tentatively a plurality of control semiconductor chips and a plurality of connecting chips onto a second support substrate, the control semiconductor chip controlling the optical chips, the connecting chips including conductive materials piercing through the connecting chips; forming a second resin layer on side surfaces of the control semiconductor chips and the connecting chips for bonding the control semiconductor chips and the connecting chips; removing the control semiconductor chips, the connecting chips, and the second resin layer from the second support substrate for forming a second chip module; and bonding vertically the first chip module and the second chip module with a bonding layer interposed therebetween.

DETAILED DESCRIPTION OF THE EMBODIMENTS

Embodiments of the invention will be described below with reference to the drawings. In the following description, the "optical element" is a concept including all elements, such as the Light Emitting Diode (LED) and optical MEMS (Micro Electro-Mechanical System), which emit and receive the light. The "control semiconductor chip" means a semiconductor chip or a semiconductor element, such as an IC, which controls the optical chip or the optical element. For example, the concept of "control" shall include a concept that drives the MEMS optical element. In the following description, the chip module means a group of same or different chips provided within a substantially same plane.

First Embodiment

A semiconductor device of the first embodiment is one in which a first chip module and a second chip module are vertically bonded with a bonding layer interposed therebetween. The first chip module includes plural optical chips that are bonded within the substantially same plane by a first resin layer. The optical chip includes an optical element. The second chip module includes plural control semiconductor chips and plural connecting chips. The control semiconductor chip controls the optical chip. The connecting chip includes a conductive material piercing through the chip. The control semiconductor chips and the connecting chips are bonded within the substantially same plane while a second resin layer is interposed between the control semiconductor chips and connecting chips and the plane. The optical chip and the control semiconductor chip are electrically connected through the connecting chip.

In the first embodiment, the optical element is a light emitting element.

Figure 1:
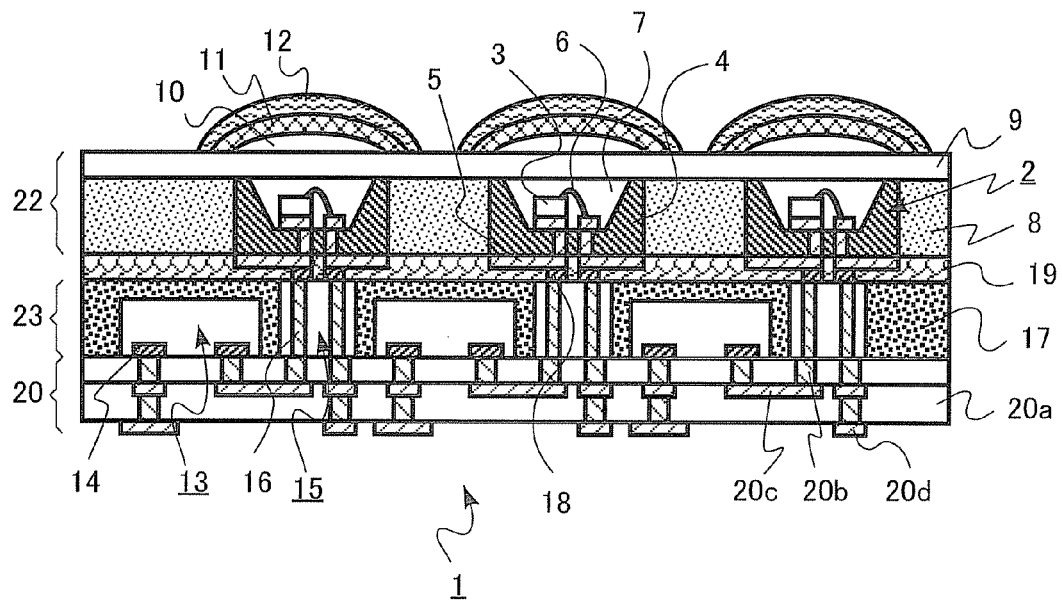
FIG. 1 is a sectional view of a semiconductor device according to a first embodiment of the invention.

FIG. 1 is a sectional view of the semiconductor device of the first embodiment. Referring to FIG. 1, in a semiconductor device 1, an LED array module 22 that is of the first chip module and a control circuit module 23 that is of the second chip module are vertically bonded by a bonding layer 19. A global interconnection layer 20 is formed on the side of the control circuit module 23 of the semiconductor device 1. The global interconnection layer 20 is used to establish connection between elements in the control circuit module 23 or to lead an electrode.

The LED array module 22 includes plural LED chips 2 that are of the optical chip. The LED chips 2 are bonded within the substantially same plane by a first resin layer 8. The LED chip 2 includes a reflector substrate 4 in which a recess is provided in a surface, an excitation light source blue LED 3 that is of the light emitting element mounted in the recess, a resin sealing layer 7, a bonding wire 6 that electrically connects a lead electrode 5 and the LED 3, which are formed in the reflector substrate 4, and a transparent resin sheet 9 that is formed on the reflector substrate 4.

A hemispherical transparent resin layer 10 is formed on the transparent resin sheet 9 immediately above the LED 3. A color conversion layer 11 and a protective resin layer 12 are provided such that the hemispherical transparent resin layer 10 is covered therewith. In the color conversion layer 11, fluorescent materials that convert blue light emitted from the LED 3 into yellow light are dispersed in transparent resin.

The control circuit module 23 includes plural control IC chips 13 each of which controls the LED chip 2 and plural connecting chips 15 in which through vias 16 are made. The through via 16 is of a conductive material piercing through the chip. The control IC chip 13 and the connecting chip 15 are bonded within the substantially same plane by the second resin layer 17. The control IC chip 13 includes a connection pad 14 that is located in one of surfaces thereof.

The global interconnection layer 20 includes a planarizing film 20a, a via 20b, an interconnection 20c, and a substrate electrode 20d.

A connection bump 18 is formed in the bonding layer 19. The lead electrode 5 of the LED chip 2 and the through via 16 of the connecting chip 15 are electrically connected by the connection bump 18. The connecting chip 15 is also connected to a control IC chip 13 using the global interconnection layer 20. Thus, the LED chip 2 and the control IC chip 13 are electrically connected through the connecting chip 15.

In the semiconductor device 1, the LED chips 2 are densely packed in one (light emitting surface) of surfaces by providing the control IC chips 13 on the lower sides of the LED chips 2. The use of the connecting chip eliminates the complicated connecting structure and process to facilitate the lead of the electrode from the rear surface, which contributes to the realization of the LED dense packaging on the light emitting surface side. Accordingly, a ratio of an irradiation region per unit area of the light emitting surface can be increased while the control IC chip 13 suppresses the luminous variation of individual LED chip 2, which allows the improvement of the illumination uniformity and illumination efficiency.

A method for manufacturing the semiconductor device of the first embodiment will be described below. FIGS. 2A to 2M are process sectional views illustrating the method for manufacturing the semiconductor device of the first embodiment.

The reflector substrate 4 is a multi-layered ceramic substrate in which a recess is provided. The lead electrode 5 is provided in the reflector substrate 4, and a reflecting layer (details are not illustrated) made of white resin is provided in a surface of the recess. The LED 3 is fixed onto one of the lead electrodes 5 by a conductive bonding agent, and electric connection to the other lead electrode 5 is secured by the bonding wire 6. In order to prevent scattering of light, silicone resin having a high refractive index is injected in the recess to form the resin sealing layer 7 after the LED 3 is packed, the silicone resin is cured to form the LED chip 2 (details are not illustrated).

Figure 2A:
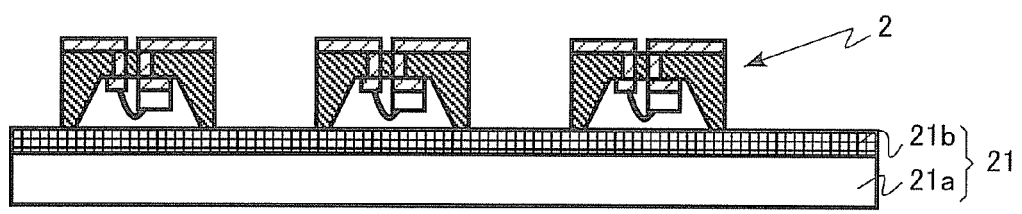
FIGS. 2A to 2M are process sectional views illustrating a method for manufacturing the semiconductor device of the first embodiment.

A process for manufacturing the LED array module 22 will be described below. A support substrate 21 is prepared as illustrated in FIG. 2A. For example, in the support substrate 21, an acrylic adhesive layer 21b having a thickness of 10 μm is formed on a glass substrate 21a having a thickness of 0.8 mm. The plural LED chips 2 are mounted at desired positions on the support substrate 21 such that upper surface sides of the LED chips 2 come into contact with the adhesive layer 21b, and the LED chips 2 are tentatively bonded by the adhesive layer 21b. For example, the LED chips 2 are disposed at intervals about 3 mm.

Figure 2B:
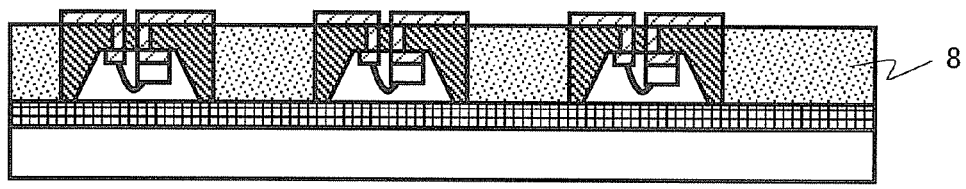
Figure 2C:
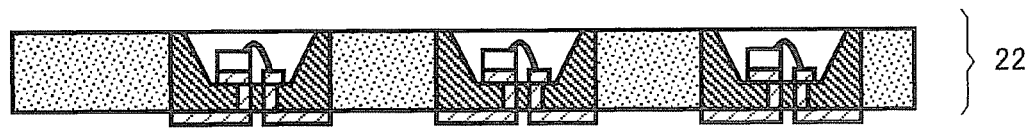

As illustrated in FIG. 2B, resin is prepared as the first resin layer 8. In the resin, for example, a filler is added to anhydride epoxy resin by 85 weight percent, and the filler mainly contains silica having an average particle diameter of 10 μm. The first resin layer 8 is formed in the gap between side surfaces of the LED chips 2 by a printing method in which a screen plate is used. Then, for example, tentative baking is performed at 100° C. for one hour, and main baking is performed at 160° C. for 30 minutes to form the LED array module 22 after the LED chips 2 are removed from the support substrate 21 (FIG. 2C).

Figure 2D:
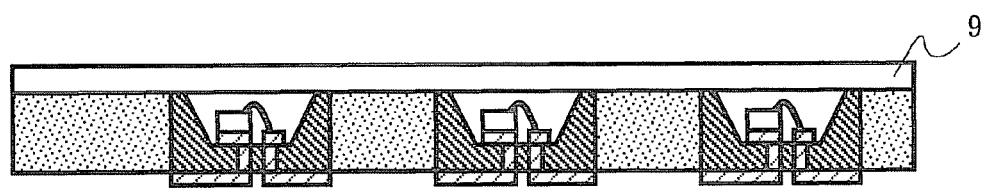

Then, for example, photosensitive epoxy resin having a thickness of 50 μm is caused to adhere as the transparent resin sheet 9 to the upper surface side of the LED array module 22, and the photosensitive epoxy resin is cured by UV irradiation (FIG. 2D).

Figure 2E:
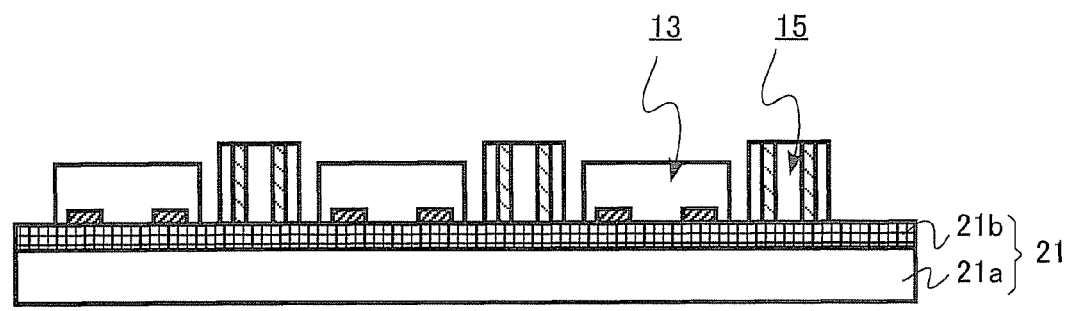

As illustrated in FIG. 2E, the control IC chip 13 and the connecting chip 15 are mounted on the support substrate 21. The control IC chip 13 includes a control IC, and a connection pad 14 is provided in a surface on the side on which the control IC chip 13 is tentatively bonded to the adhesive layer 21*b*. A through-hole of 100 μmϕ is made in the silicon connecting chip 15 by blasting, and the through-hole pierces through the connecting chip 15. The through-hole is filled with a silver paste that is of a conductive material, thereby forming a through via 16. For example, a gap between the control IC chip 13 and the connecting chip 15 is about 0.5 mm.

Figure 2F:
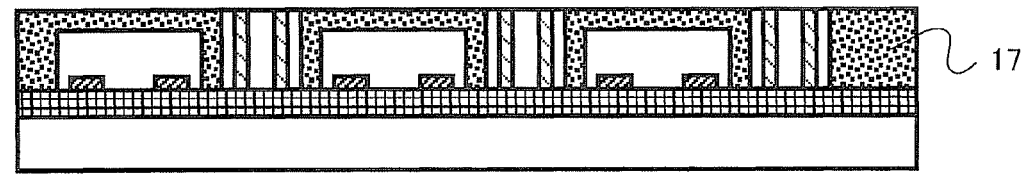

As illustrated in FIG. 2F, for example, resin is prepared as the second resin layer 17. In the resin, the filler is added to anhydride epoxy resin by 80 weight percent, and the filler mainly contains silica having the average particle diameter of 10 μm. The second resin layer 17 is formed in the gap between the LED chips 2 by a printing method in which the screen plate is used. Then, for example, the tentative baking is performed at 100° C. for one hour, and the main baking is performed at 160° C. for 30 minutes to form the control circuit module 23 after the LED chips 2 are removed from the support substrate 21.

Figure 2G:
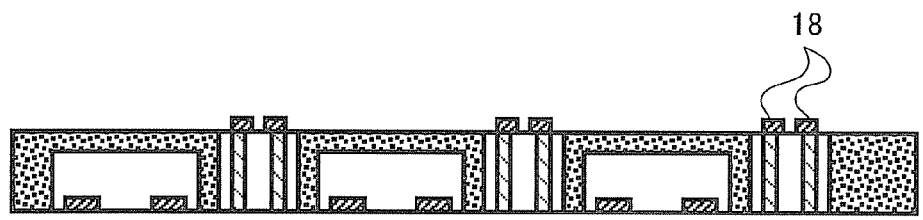
Figure 2H:
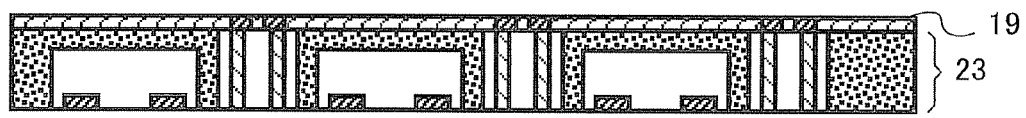

On the rear surface side of the control circuit module 23, the connection bump 18 is formed on the through via 16 of the connection chip 15 by a solder bump (FIG. 2G). Then, for example, resin is printed to form the bonding layer 19. In the resin, the filler is added to anhydride epoxy resin by 70 weight percent, and the filler mainly contains silica having the average particle diameter of 10 μm (FIG. 2H).

Figure 2I:
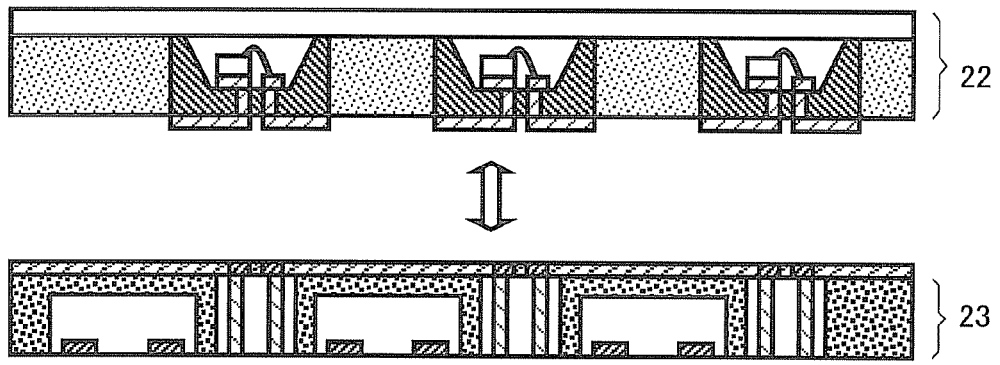
Figure 2J:
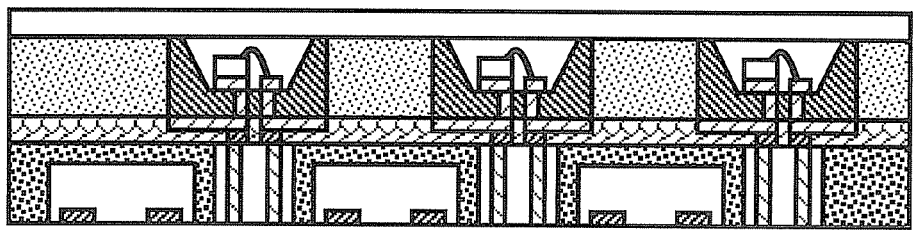

As illustrated in FIG. 2I, the rear surfaces of the LED array module 22 and control circuit module 23 are aligned with each other and bonded by the bonding layer 19. After the bonding, for example, the tentative baking is performed at 100° C. for one hour, and the main baking is performed at 160° C. for 30 minutes to form the semiconductor device (FIG. 2J).

Figure 2K:
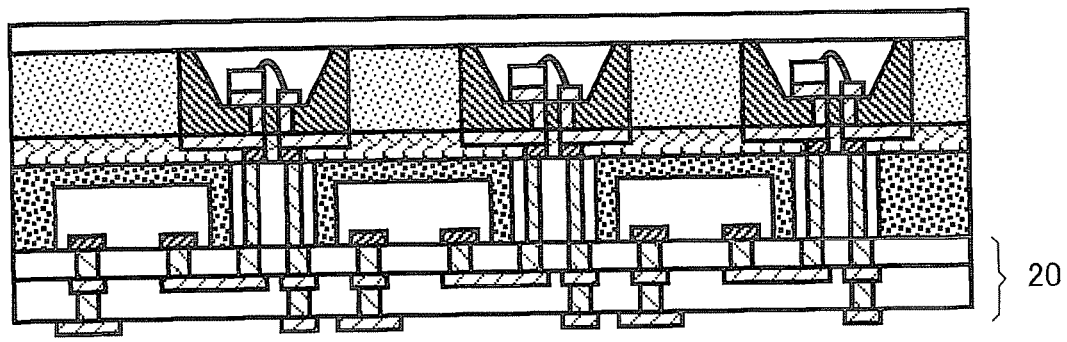

The global interconnection layer 20 including the planarizing film 20*a* made of polyimide resin, the via 20*b*, the interconnection 20*c*, and the substrate electrode 20*d* made of aluminum is formed in a semiconductor device surface corresponding to an active surface of the control IC chip 13 and to the through via 16 of the connection chip 15 through a photolithographic process (FIG. 2K).

Figure 2L:
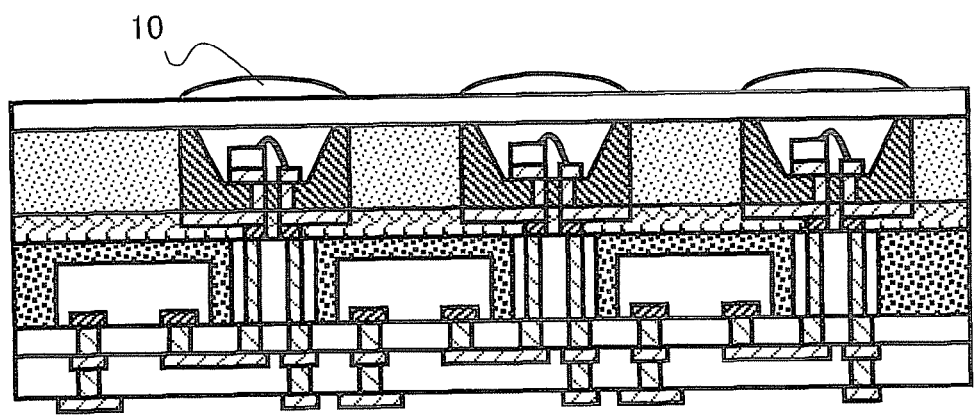

Using a metal mask in which a circular opening is provided in the transparent resin sheet 9, silicone resin is printed immediately above the LED 3 by screen printing. Then the hemispherical silicone transparent resin layer 10 is obtained by performing the baking at 150° C. for 30 minutes (FIG. 2L).

Figure 2M:
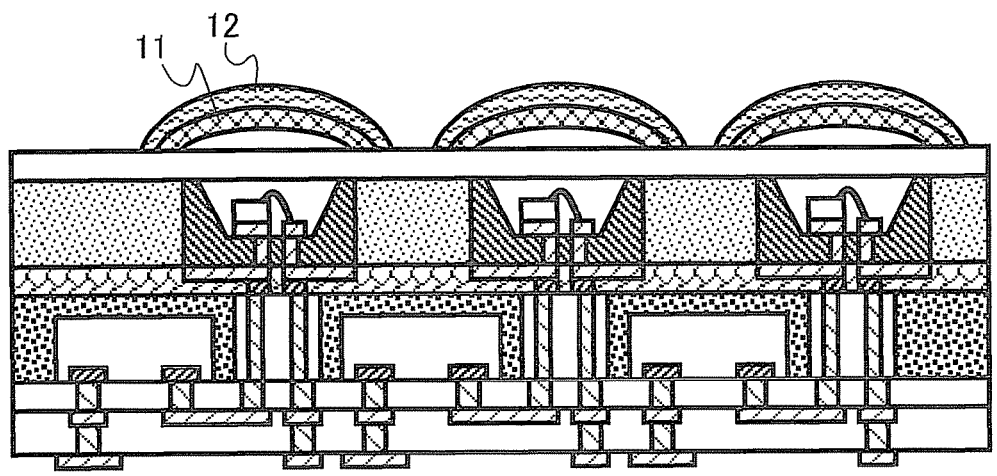

Using a mask whose opening diameter is slightly wider than that of a mask for printing the transparent resin layer 10, the color conversion layer 11 is printed on the hemispherical silicone transparent resin layer 10. In the color conversion layer 11, silicate yellow fluorescent materials are dispersed in silicone resin. Using a mask whose opening diameter is slightly wider than that of a mask for printing the color conversion layer 11, the silicone resin is printed after the baking at 150° C. for 30 minutes, and then the protective resin layer 12 is obtained by performing the baking at 150° C. for 30 minutes (FIG. 2M). Therefore, the lenticular transparent resin layer 10, the color conversion layer 11, and the protective resin layer 12 are formed on the transparent resin sheet 9. In the color conversion layer 11, fluorescent materials that absorb the blue light emitted from the LED 3 and convert the blue light into the yellow light are dispersed in transparent resin. The protective resin layer 12 prevents degradation of the fluorescent material.

Figure 3A:
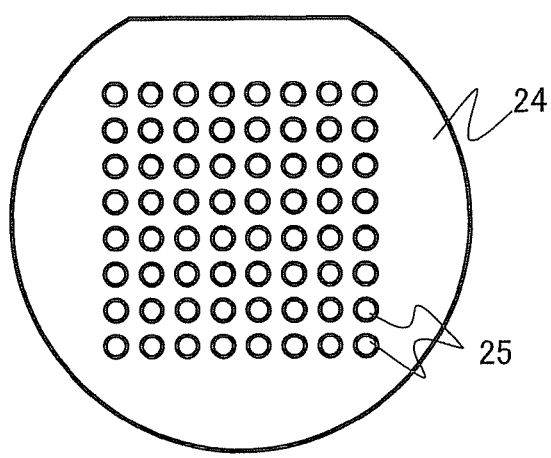
FIGS. 3A to 3C illustrate a method for manufacturing a connecting chip of the first embodiment.
Figure 3B:
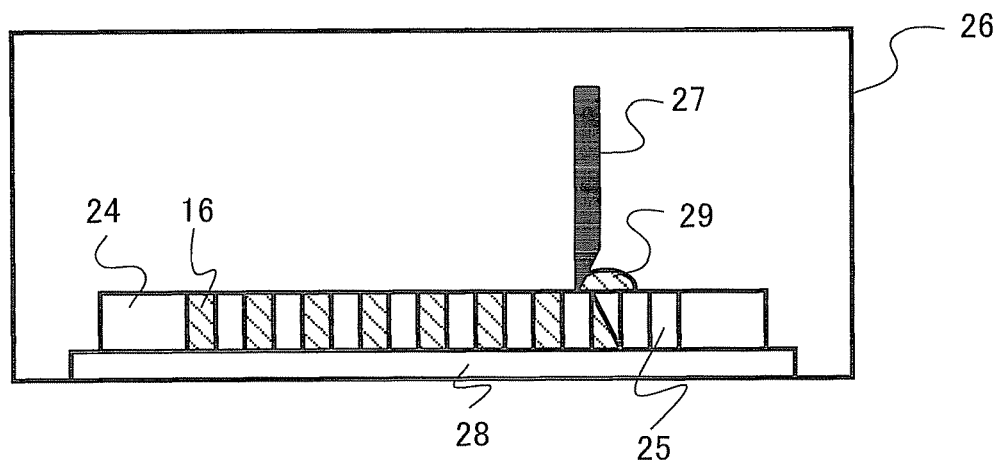
Figure 3C:
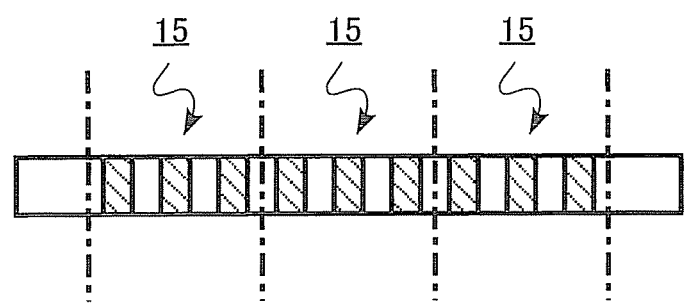

FIGS. 3A to 3C illustrate a method for manufacturing the connecting chip of the first embodiment. A resist layer in which openings are provided at desired positions is formed in a silicon substrate 24, the openings are grounded by blasting to form through-holes 25 (details are not illustrated), and the resist layer is removed (FIG. 3A).

Then, a substrate is placed in a vacuum chamber 26, and a conductive material 29 is applied to an end portion of the substrate. The vacuum chamber 26 is evacuated up to 10 kPa, and the conductive material 29 is buried and printed in the through-hole 25 with a squeegee 27, thereby forming the through via 16 filled with the conductive material (FIG. 3B) Alternatively, a screen plate in which a circular opening corresponding to the through-hole 25 may be used in printing the conductive material 29 for preventing from the contamination of the substrate surface. Alternatively, conductive material 29 may be buried in the substrate before removing the resist layer above mentioned and the resist layer may be removed after printing. The chip is diced into a desired size to obtain the connecting chip 15 (FIG. 3C).

In the first embodiment, the silicon substrate is used as the connecting chip 15. Alternatively, a glass substrate or a substrate made of epoxy resin to which the filler is added may be used as the connecting chip 15. In the first embodiment, the blasting is used as the method for forming the opening. Alternatively, the opening may be formed by etching or laser forming. For the resin substrate, the printing may be performed using a screen plate in which processing is performed in a region corresponding to the opening portion such that the printing paste does not pass. Alternatively, the substrate is ground to obtain the desired thickness after the through-holes are made, whereby the connection chip 15 can be formed into a convenient shape according to the module thickness.

In the first embodiment, the transparent resin sheet 9 is caused to adhere. Alternatively, printing the silicone resin with the desired thickness, and baking may be performed to obtain the transparent resin layer.

The blue LED 3 that is of the light emitting element and the color conversion layer 11 are used in the first embodiment. In the color conversion layer 11, the fluorescent materials that absorb the blue light emitted from the blue LED 3 and convert the blue light into the yellow light are dispersed in the transparent resin. Alternatively, a near-ultraviolet LED may be used as the light emitting element. At this point, a structure in which the fluorescent materials that absorb the near-ultraviolet light and convert the near-ultraviolet light into red (R), green (G), and blue (B) colors are dispersed in the same resin layer may be used in the color conversion layer, or a multi-layer structure may be used (not illustrated). In the multi-layer structure, the color conversion layers in which the fluorescent materials that convert the near-ultraviolet light into red (R), green (G), and blue (B) colors are dispersed in the resin layers are stacked in this order on the hemispherical transparent resin layer 10.

Consequently, the high-luminous-efficiency semiconductor device in which the LED chips are densely packed in one of the surfaces while the electrically-connected control IC chip suppresses the luminous variation can easily be produced by the manufacturing method of the first embodiment.

Second Embodiment

A semiconductor device according to a second embodiment of the invention differs particularly from the semiconductor device of the first embodiment in that the semiconductor device of the second embodiment includes a heat radiation metal chip that is bonded within the substantially same plane along with the control semiconductor chip and the connecting chip. The heat radiation metal chip is bonded with the control semiconductor chip and/or the connecting chip by the second resin layer. Hereinafter, the description of contents overlapping the first embodiment is omitted.

Figure 4:
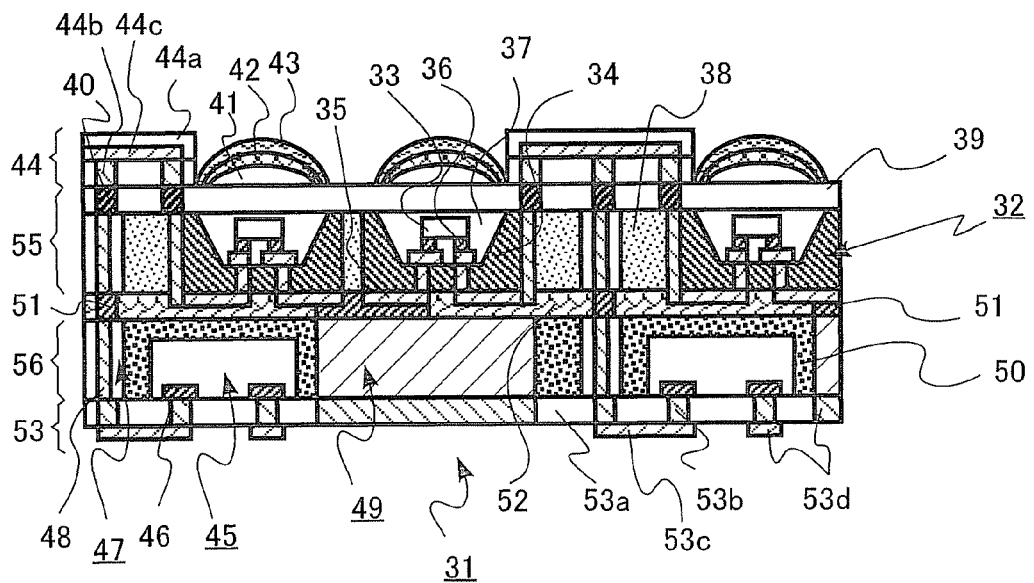
FIG. 4 is a sectional view of a semiconductor device according to a second embodiment of the invention.

FIG. 4 is a sectional view of the semiconductor device of the second embodiment. Referring to FIG. 4, in a semiconductor device 31, an LED array module 55 that is of the first chip module and a control circuit module 56 that is of the second chip module are vertically bonded by a bonding layer 52.

The LED array module 55 includes plural LED chips 32 that are of the optical chip. The LED array module 55 also includes plural connecting chips 47 in which through vias 48 are made. The LED chips 32 and the connecting chip 47 are bonded within the substantially same plane by a first resin layer 38.

The LED chip 32 includes a reflector substrate 34 in which a recess is provided in a surface, an excitation light source blue LED 33 that is of the light emitting element mounted in the recess, a resin sealing layer 37, a bump 36 that electrically connects a lead electrode 35 and the LED 33, which are formed in the reflector substrate 34, and a transparent resin sheet 39 that is formed on the reflector substrate 34.

The control circuit module 56 includes plural control IC chips 45 each of which controls the LED chip 32 and connecting chips 47 in which through vias 48 are made. The through via 48 is of a conductive material piercing through the chip. The control circuit module 56 also includes a heat radiation metal chip 49. The control IC chip 45, the connecting chip 47, and the metal chip 49 are bonded within the substantially same plane by a second resin layer 50. The control IC chip 45 includes a connection pad 46 that is located in one of surfaces thereof.

In the LED array module 55 and the control circuit module 56, the electric connection between the through vias 48 is secured by a connection electrode 51 formed between the connecting chips 47 of the modules. While the electric connection is established between the connection electrode 51 and the lead electrode 35 of the LED chip 32, the connection electrode 51 formed on the heat radiation metal chip 49 is bonded by the resin layer 52 to form the semiconductor device 31.

In the semiconductor device 31, a first global interconnection layer 44 is formed on the side of the transparent resin sheet 39 that is of the light emitting surface of the LED chip 32. The first global interconnection layer 44 includes a first planarizing film 44a, a via 44b formed in a position corresponding to a connection via 40, and an interconnection 44c. A lens-shaped transparent resin layer 41, a color conversion layer 42 made of a fluorescent material, and a protective resin layer 43 is formed in a position corresponding to the luminous region.

A second global interconnection layer 53 is formed on the side of the control IC chip 45. The second global interconnection layer 53 includes a connection via 53b that is provided in a position corresponding to the through via 48 of the connecting chip 47, the heat radiation metal chip 49, and the connecting pad 46 of IC chip 45, a second planarizing film 53a, an interconnection 53c and a substrate electrode 53d.

In the LED array module 55, one of the lead electrodes 35 of the LED chip 32 is electrically connected to the control IC chip 45 of the control circuit module 56 through the connection via 40, the first global interconnection layer 44, and the connecting chip 47. The other lead electrode 35 is connected to the connection electrode 51 and the heat radiation metal chip 49 of the control circuit module 55. Thus, the LED chip 32 and the control IC chip 45 are electrically connected through the connecting chip 47.

In the conventional configuration in which the LED (Light Emitting Diode) is buried in resin, there is a problem in that the heat is hardly radiated to degrade the luminous efficiency. On the other hand, in the semiconductor device 31 of the second embodiment, the high heat radiation effect can be realized by providing the heat radiation metal chip 49 in the rear surface of the LED chip 32. Accordingly, the effect that the degradation of the luminous efficiency by heat generation can be suppressed is obtained in addition to the effect of the first embodiment.

In the second embodiment, desirably the filler of the second resin layer 50 mainly contains AlN. This is because the heat radiation effect onto the rear surface side can further be enhanced when the filler of the second resin layer 50 mainly contains AlN having the high thermal conductivity. From the similar viewpoint, desirably the filler of the bonding layer 52 mainly contains AlN.

A method for manufacturing the semiconductor device of the second embodiment will be described below. FIGS. 5A to 5L are process sectional views illustrating the method for manufacturing the semiconductor device of the second embodiment.

Because the process for manufacturing the LED chip 32 is similar to that of the first embodiment, the description is omitted.

Figure 5A:
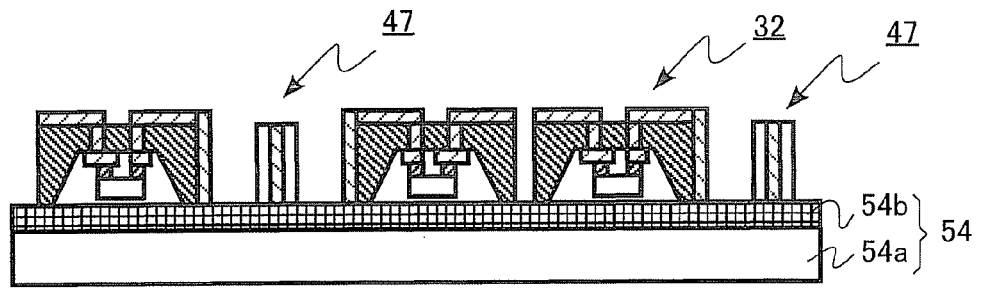
FIGS. 5A to 5L are process sectional views illustrating a method for manufacturing the semiconductor device of the second embodiment.

As with the manufacturing method of the first embodiment, a support substrate 54 is prepared as illustrated in FIG. 5A. For example, in the support substrate 54, an acrylic adhesive layer 54b having a thickness of 10 μm is formed on a glass substrate 54a having a thickness of 0.8 mm. The plural LED chips 32 are mounted at desired positions on the support substrate 54 such that upper surface sides of the LED chips 32 come into contact with the adhesive layer 54b, and the connecting chips 47 are tentatively bonded by the adhesive layer 54b.

The LED chip 32 includes the reflector substrate 34 in which the recess is provided in the surface, the LED 33 that is mounted in the recess, the resin sealing layer 37 with which the recess is filled, and the bump 36 that electrically connects the lead electrode 35 and the LED 33, which are formed in the reflector substrate 34. For example, the LED chips 32 are disposed at intervals about 1 mm. In the connecting chip 47, an opening of 100 μmφ is formed in glass having the thickness of 0.2 mm by blasting, and the opening is filled with a conductive paste.

Figure 5B:
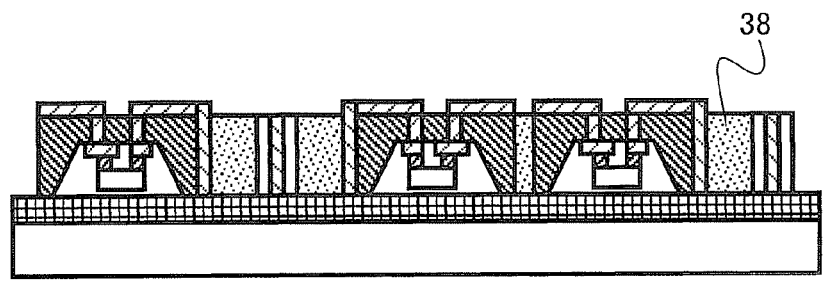
Figure 5C:
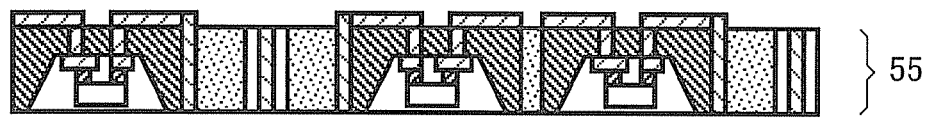

As illustrated in FIG. 5B, for example, resin is prepared as the first resin layer 38. In the resin, the filler is added to anhydride epoxy resin by 80 weight percent, and the filler mainly contains silica having the average particle diameter of 10 μm. The first resin layer 38 is formed in the gap between the LED chips 32 and the connecting chip 47 by the printing method in which the screen plate is used. Then, for example, the tentative baking is performed at 100° C. for one hour, and the main baking is performed at 160° C. for 30 minutes to form the LED array module 55 after the support substrate 54 is removed (FIG. 5C).

Figure 5D:
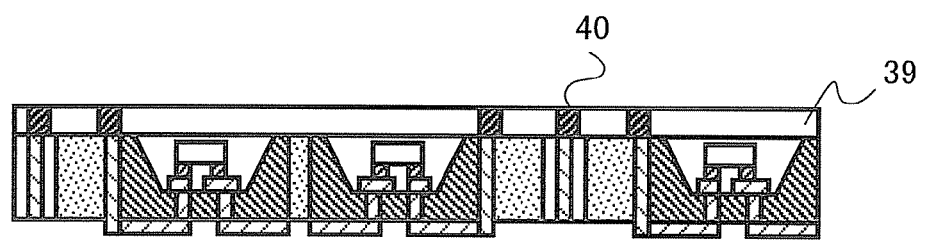

Then, for example, the photosensitive epoxy resin 39 having the thickness of 50 μm is caused to adhere onto the upper surface side of the LED array module 55, an opening of 100 μmφ is provided in a desired position, the opening is filled with the conductive paste to form the connection via 40, and the conductive paste is cured by the UV irradiation (FIG. 5D).

Figure 5E:
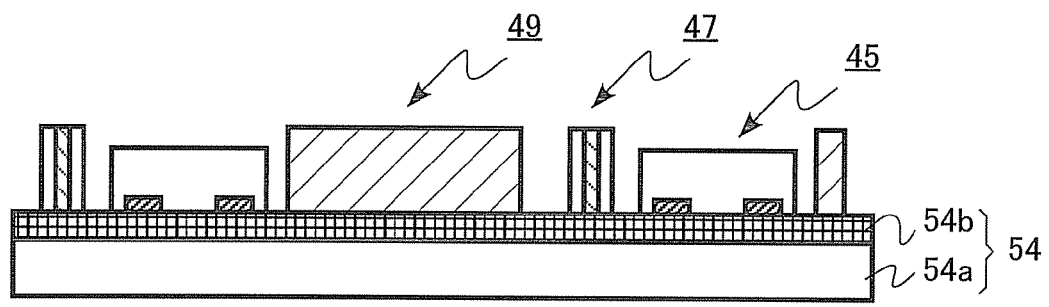

As illustrated in FIG. 5E, the control IC chip 45, the connecting chip 47, and the metal chip 49 made of, for example, Cu are mounted on the support substrate 54 and tentatively bonded. The control IC chip 45 includes a control IC, and the connection pad 46 is provided in the surface on the side on which the control IC chip 45 is tentatively bonded to the adhesive layer 54b. For example, the chips are disposed at intervals about 0.5 mm.

Figure 5F:
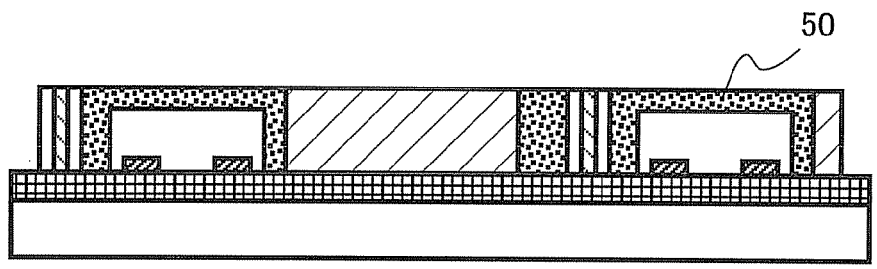
Figure 5G:
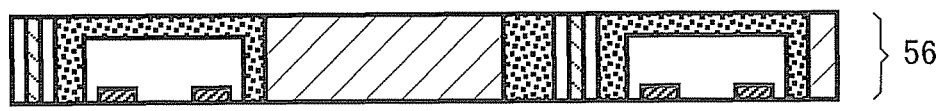

As illustrated in FIG. 5F, resin is prepared as the second resin layer 50. In the resin, for example, the filler is added to anhydride epoxy resin by 85 weight percent, and the filler mainly contains AlN having the average particle diameter of 10 μm. The second resin layer 50 is formed in the gap between the chips by the printing method in which the screen plate is used. Then, for example, the tentative baking is performed at 100° C. for one hour, and the main baking is performed at 160° C. for 30 minutes to form the control circuit module 56 after the support substrate 54 is removed (FIG. 5G).

Figure 5H:
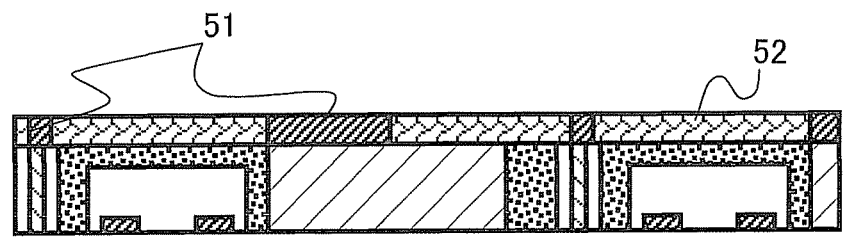

On the rear surface side of the control circuit module 56, using the conductive paste, the connection electrode 51 is formed in a desired position of the Cu metal chip 49 by the screen printing. At the same time, the conductive paste is also applied in a position corresponding to the through via 48 of the connection chip 47 and tentatively burned. Then, for example, resin is applied to form the bonding layer 52 by the screen printing. In the resin, the filler is added to anhydride epoxy resin by 70 weight percent, and the filler mainly contains AlN having the average particle diameter of 10 μm (FIG. 5H).

Figure 5I:
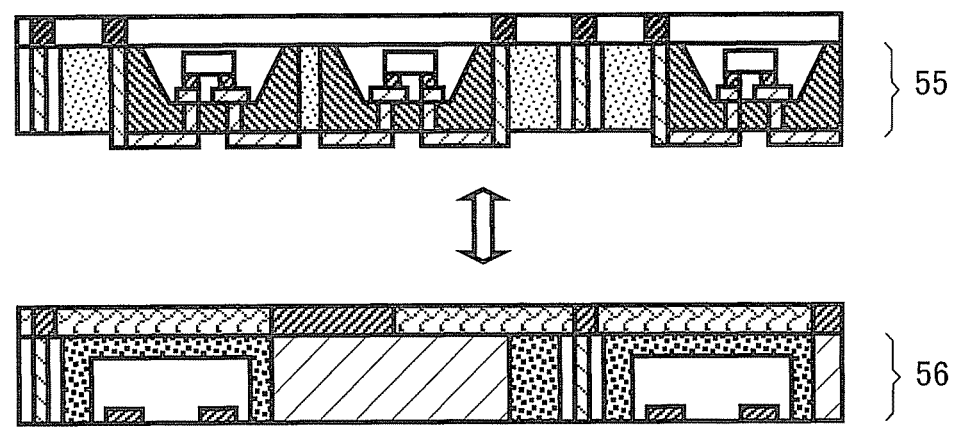

As illustrated in FIG. 5I, the rear surfaces of the LED array module 55 and control circuit module 56 are aligned with each other and bonded by the bonding layer 52. After the bonding, the tentative baking is performed at 100° C. for one hour, and the main baking is performed at 160° C. for 30 minutes to form the semiconductor device.

Figure 5J:
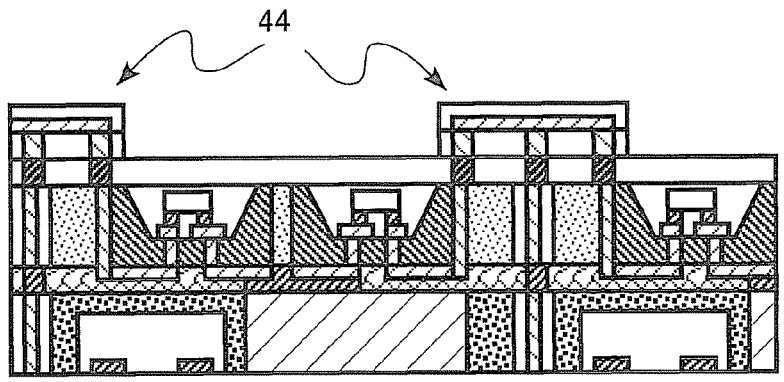
Figure 5K:
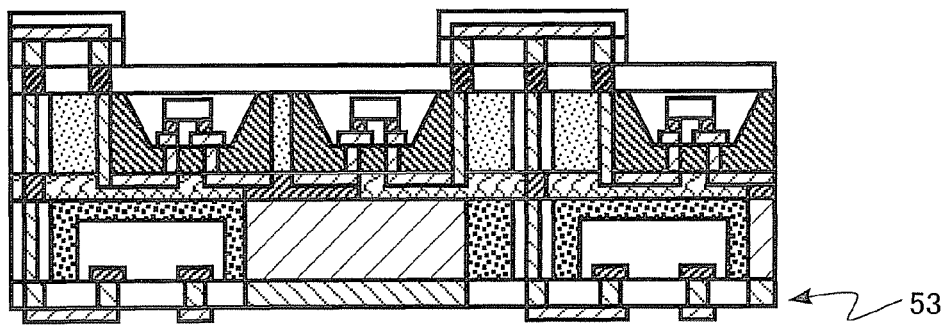

The first global interconnection layer 44 including the planarizing film 44a made of polyimide resin and the through via 44b and the interconnection 44c made of aluminum is formed in one of semiconductor device surfaces corresponding to the connection via 40 of the transparent resin sheet 39 through the photolithographic process (FIG. 5J). In the other semiconductor device surface, a second global interconnection layer 53 is formed in a position corresponding to an active surface of the control IC chip 45 through the photolithographic process. The second global interconnection layer 53 includes the planarizing film 53a made of polyimide resin, the through via 53b, the interconnection layer 53c, and the substrate electrode 53d made of aluminum (FIG. 5K). At this point, in order to improve the heat radiation characteristic, a conductive paste layer made of the Ag paste or Cu paste may be formed on the substrate electrode 53d formed by the aluminum layer to enhance the efficiency of the heat radiation from the metal chip 46.

Figure 5L:
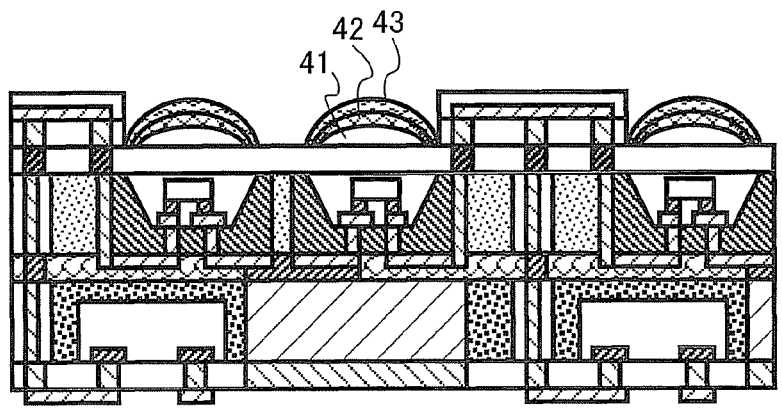

As illustrated in FIG. 5L, the hemispherical silicone transparent resin layer 41, the color conversion layer 42 made of fluorescent material, and the protective resin layer 43 are formed on the transparent resin sheet 39 by the process similar to that of the first embodiment.

Consequently, the high-luminous-efficiency semiconductor device in which the LED chips are densely packed in one of the surfaces while the electrically-connected control IC chip suppresses the luminous variation can easily be implemented by the manufacturing method of the second embodiment. In the second embodiment, the metal chip is disposed in the rear surface of the LED device, so that the heat can be radiated from the other surface side with the high heat radiation effect. The AlN particles having the high thermal conductivity are added with the high additive rate as the filler included in the second resin layer and the bonding layer, the high heat radiation effect can be obtained in the resin layer to stably emit the light.

In the second embodiment, the fillers of the resin layers 38 and 50 and the bonding layer 52 mainly contain MN that is of the inorganic material having the high thermal conductivity. Alternatively, for example, the heat radiation characteristic may be improved using carbon filler or filler in which metal fine particles are coated with resin.

Third Embodiment

A semiconductor device according to a third embodiment differs particularly from semiconductor device of the first embodiment in that the semiconductor device of the third embodiment includes a heat radiation metal chip that is bonded within the substantially same plane along with the control semiconductor chip and/or the connecting chip by the second resin layer. Hereinafter, the description of contents overlapping the first embodiment is omitted. The semiconductor device of the third embodiment has a structure that is simpler than that of the second embodiment.

Figure 6A:
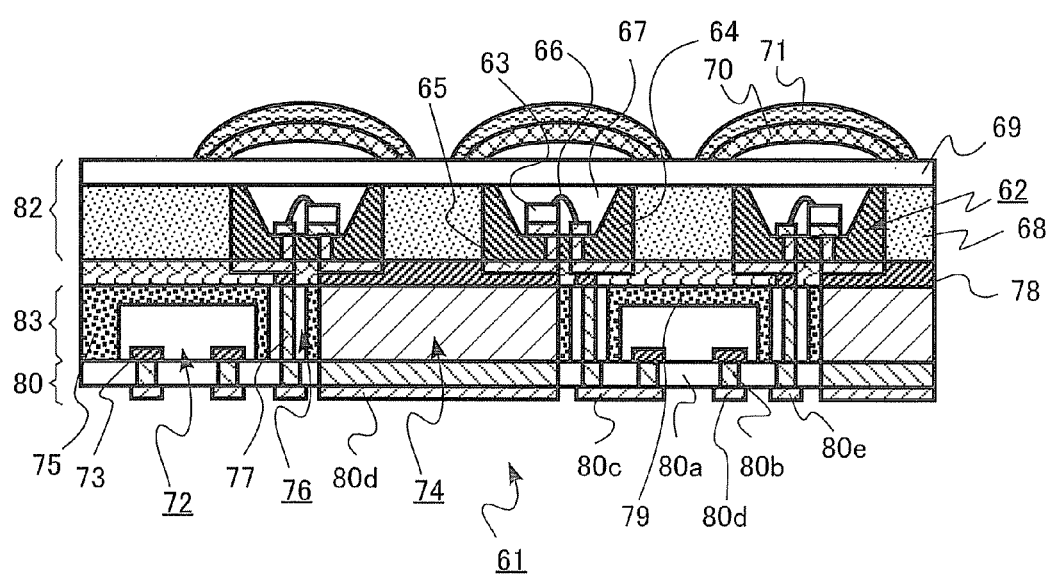
FIGS. 6A and 6B are sectional views of a semiconductor device according to a third embodiment of the invention.

FIG. 6A is a sectional view of the semiconductor device of the third embodiment. In a semiconductor device 61, an LED array module 82 that is of a first chip module and a control circuit module 83 that is of a second chip module are vertically bonded by a bonding layer 79. A global interconnection layer 80 is formed on the side of the control circuit module 83 of the semiconductor device 61 in order to connect the elements in the control circuit module 83 or to lead the electrode.

Figure 6B:
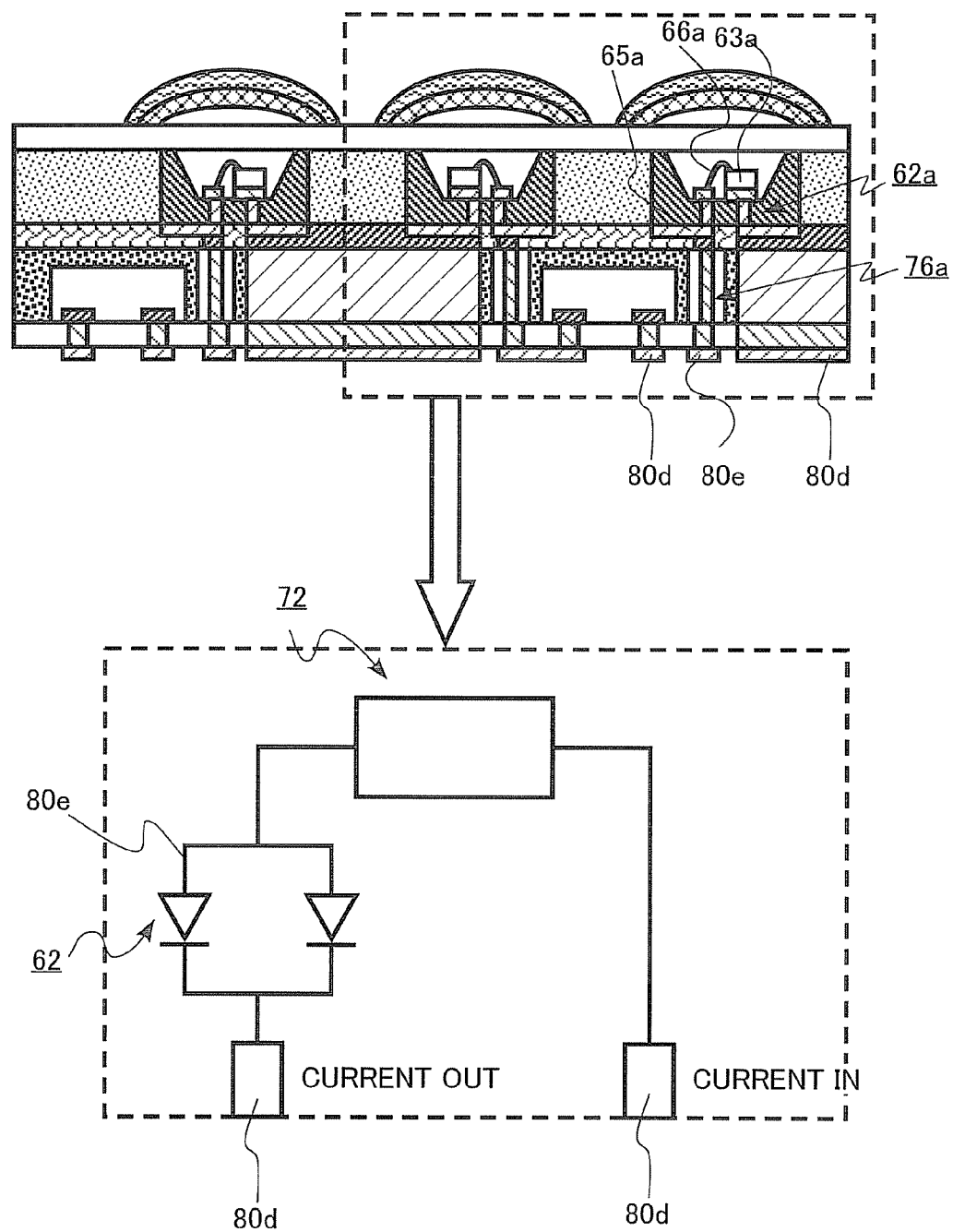

The global interconnection layer 80 includes a planarizing film 80a, a via 80b, an interconnection 80c, a substrate electrode 80d, and an interconnection 80e. In the third embodiment, plural LED devices are connected in parallel and controlled by one control IC. FIG. 6B illustrates an interconnection. For example, an LED chip 62a at the right end of FIG. 6B is connected to the interconnection 80e of the global interconnection layer 80 through a wire 66a bonded to LED 63a, a lead electrode 65a, and a connection chip 76a. The LED chip 62a and an LED chip adjacent to the LED chip 62a are connected to a control IC 72 by installation of the interconnection in an uppermost surface (not illustrated) of the global interconnection layer.

The LED array module 82 includes plural LED chips 62 that are of an optical chip. The LED chips 62 are bonded within the substantially same plane by a first resin layer 68.

The LED chip 62 includes a reflector substrate 64 in which a recess is provided in a surface, an excitation light source blue LED 63 that is of the light emitting element mounted in the recess, a resin sealing layer 67, a lead electrode 65 that is formed in the reflector substrate 64, and a bonding wire 66 that electrically connects the lead electrode 65 and a LED 63.

A transparent resin sheet 69 in which a projection is formed is provided on the light emitting surface side of the LED chip 62. A color conversion layer 70 and a protective resin layer 71 are provided on the transparent resin sheet 69. In the color conversion layer 70, fluorescent materials that absorb the blue light emitted from the LED 63 and convert the blue light into the yellow light are dispersed in transparent resin.

The control circuit module 83 includes plural control IC chips 72 that control the LED chips 62 and a connecting chip 76 in which a through via 77 is formed. The through via 77 is made of a conductive material piercing through the connecting chip 76. The control circuit module 83 includes a heat radiation metal chip 74. The control IC chip 72, the connecting chip 76, and the metal chip 74 are bonded within the substantially same plane by a second resin layer 75. The control IC chip 72 includes a connection pad 73 that is located in one of surfaces thereof.

The electric connection between the LED array module 82 and the control circuit module 83 is secured by a connection electrode 78 formed between the modules and the through via 77 formed in the connecting chip 76. The LED array module 82 and the control circuit module 83 are joined by the bonding layer 79 to form the semiconductor device 61. Thus, the LED chip 62 and the control IC chip 72 are electrically connected through the connecting chip 76.

In the third embodiment, the semiconductor device having the high luminous uniformity and luminous efficiency can be implemented by the simpler structure.

A method for manufacturing the semiconductor device of the third embodiment will be described below. FIGS. 7A to 7H are process sectional views illustrating the method for manufacturing the semiconductor device of the third embodiment.

Figure 7A:
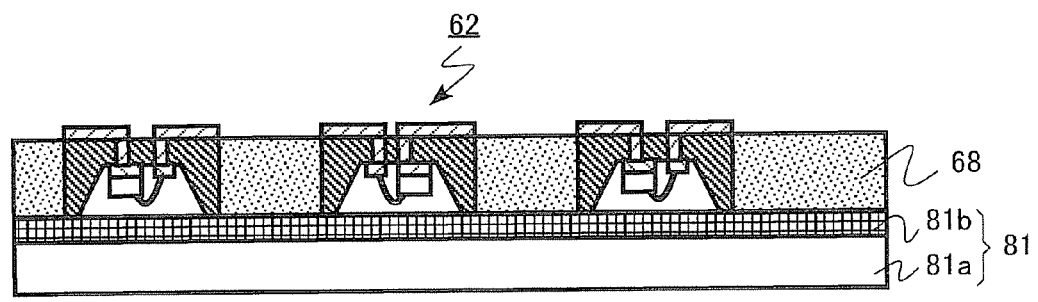
FIGS. 7A to 7H are process sectional views illustrating a method for manufacturing the semiconductor device of the third embodiment.

The LED array module 82, in which the plural LED chips 62 are bonded by the first resin layer 68, is formed by the method similar to the method for manufacturing the LED array module of the first embodiment. For example, the first resin layer 68 is made of resin in which a filler mainly containing silica having the average particle diameter of 10 μm is added to anhydride epoxy resin by 85 weight percent (FIG. 7A).

Figure 7B:
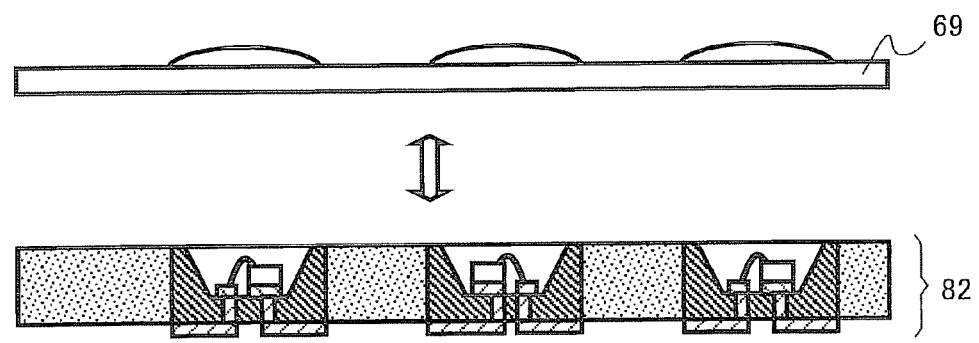
Figure 7C:
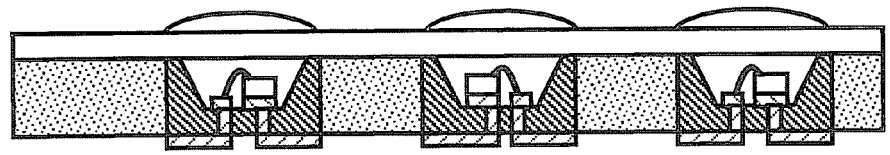

The transparent resin sheet with projection 69 formed by a resin imprint method that is of an embossing molding method is added to the LED array module 82, and then the resin is cured (FIGS. 7b and 7c).

Figure 7D:
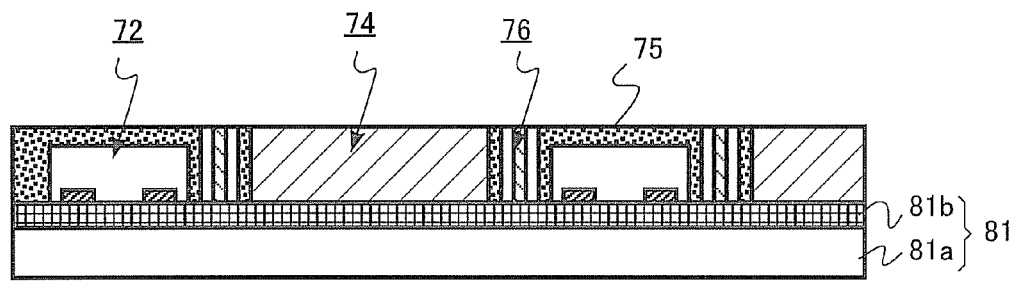

Then, a substrate in which an adhesive film 81b is caused to adhere to a glass substrate 81a having a thickness of 0.8 mm is prepared as the support substrate 81 by the method similar to the method for manufacturing the control circuit module of the first embodiment. In the adhesive film 81b, acrylic adhesive layers having a thickness of 10 μm are formed in both surfaces of a PET film having a thickness of 0.1 mm. The plural control IC chips 72, the metal chip 74, and the connecting chip 75 are tentatively fixed onto the support substrate 81. Then, the control circuit module 83 in which the plural control IC chips 72, the metal chip 74, and the connecting chip 76 are bonded by the second resin layer 75 is formed. For example, the second resin layer 75 is made of resin in which a filler is added to anhydride epoxy resin by 80 weight percent, and the filler mainly contains silica having the average particle diameter of 10 μm. (FIG. 7D).

Figure 7E:
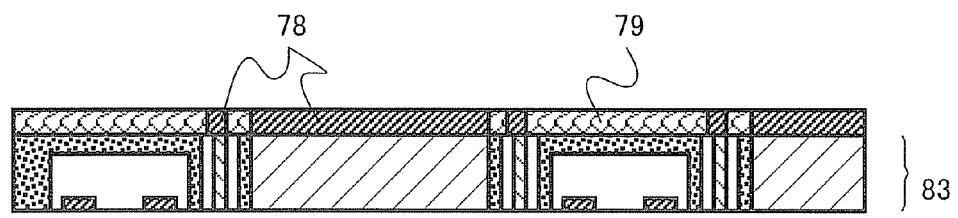
Figure 7F:
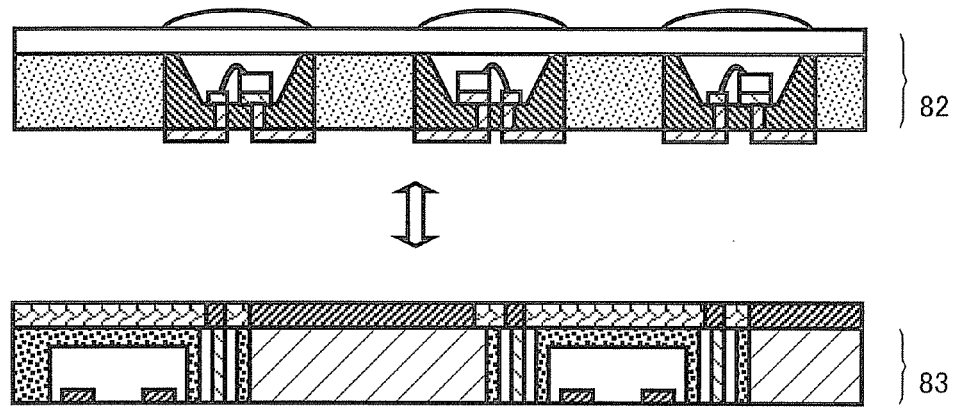

On the rear surface side of the control circuit module 83, the connection electrode 51 is formed using the conductive paste. Then, for example, resin is printed to form the bonding layer 79. In the resin, a filler is added to anhydride epoxy resin by 70 weight percent, and the filler mainly contains silica having an average particle diameter of 10 μm (FIG. 7E). The control circuit module 83 and the LED array module 82 are joined (FIG. 7F).

Figure 7G:
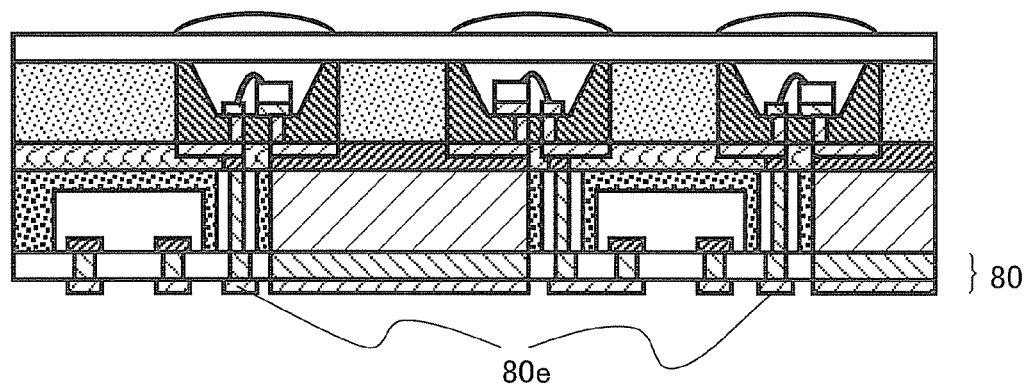
Figure 7H:
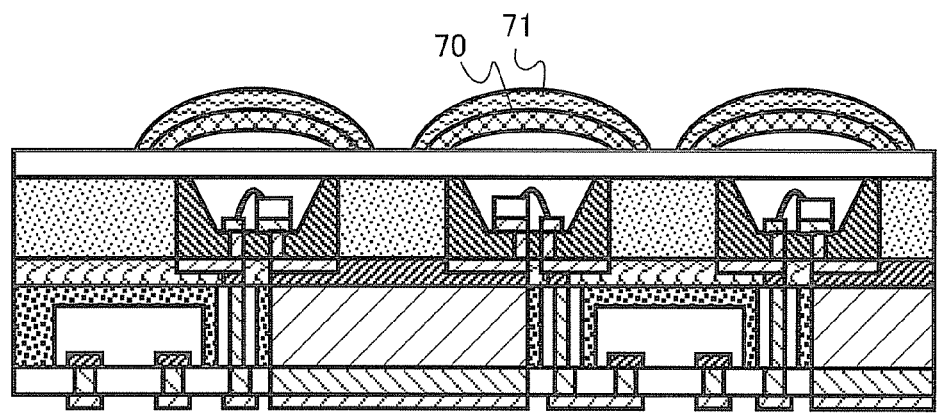

As illustrated in FIG. 7G, the global interconnection layer 80 is formed through the process similar to that of the first and second embodiments. As illustrated in FIG. 7H, the color conversion layer 70 and the protective resin layer 71 are formed on the projection of the transparent resin sheet with projection 69 through the process similar to that of the first and second embodiments.

Figure 8A:
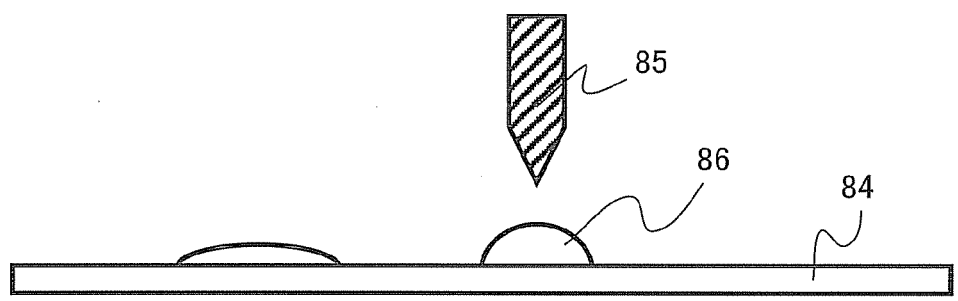
FIGS. 8A to 8C illustrate an example of a method for manufacturing a transparent resin sheet of the third embodiment.
Figure 8B:
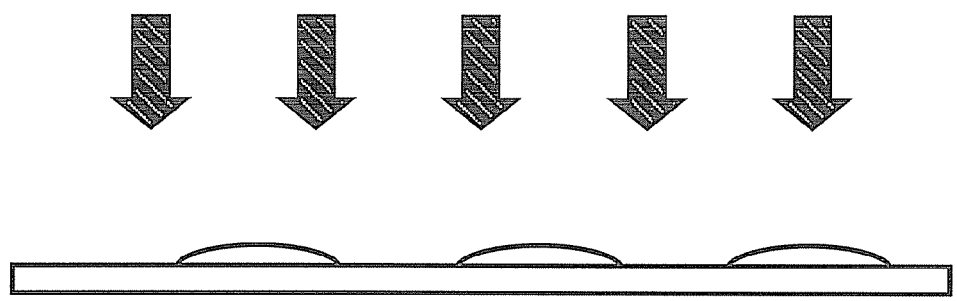
Figure 8C:
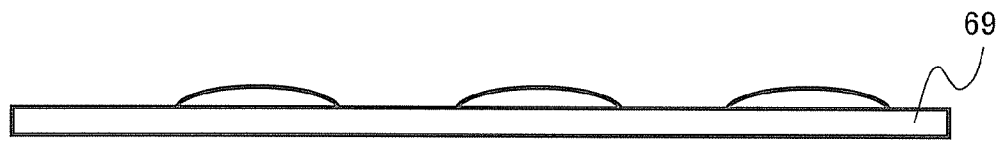

In the third embodiment, the embossing molding method is adopted as the process for manufacturing the transparent resin sheet with projection 69. FIGS. 8A to 8C illustrate an example of a method for manufacturing the transparent resin sheet with projection. A UV-cured resin 86 is caused to drop on a base material of the silicone-resin transparent resin sheet 84 with a dispenser 85. The UV-cured resin 86 is left until the UV-cured resin 86 becomes a desired lens shape by a surface tension, and the UV-cured resin 86 is cured by the UV irradiation. Then UV-cured resin 86 is cured at 100° C. for 10 minutes to obtain the transparent resin sheet with projection 69. Accordingly, the transparent resin sheet with projection 69 may be produced.

At this point, a transparent bonding resin layer that is of the bonding layer is applied to the rear surface of the sheet, and the sheet is bonded. Then the bonding layer is cured. Alternatively, after the sheet-like film of the first embodiment made of the UV-cured resin is bonded to the LED array module, the UV-cured resin is caused to drop with the dispenser, and the UV-cured resins may be collectively cured by the UV irradiation after the lens shape is formed by the surface tension, thereby curing the transparent resin sheet and the lens portion to form the transparent resin sheet with projection.

In the manufacturing method of the third embodiment, the semiconductor device having the high luminous uniformity and luminous efficiency can be implemented by the simpler structure.

Fourth Embodiment

A semiconductor device according to a fourth embodiment is a semiconductor device in which a first chip module and a second chip module are vertically bonded by a bonding layer. In the semiconductor device of the fourth embodiment, the first chip module includes plural optical chips that include optical elements bonded within the substantially same plane by a first resin layer, the second chip module includes plural heat radiation metal chips that are bonded within the substantially same plane by a second resin layer and plural connecting chips that include conductive materials piercing through the connecting chips, and the optical chip and an electrode pad of the second chip module are electrically connected through a connecting chip. The electrode pad of the second chip module is provided in a surface on the opposite side from the first chip module.

A semiconductor device of the fourth embodiment differs particularly from the semiconductor device of the second embodiment in that the control semiconductor chip is not used. The semiconductor device of the fourth embodiment is useful when the optical elements such as the LED chips having relatively even outputs can be used.

Figure 9:
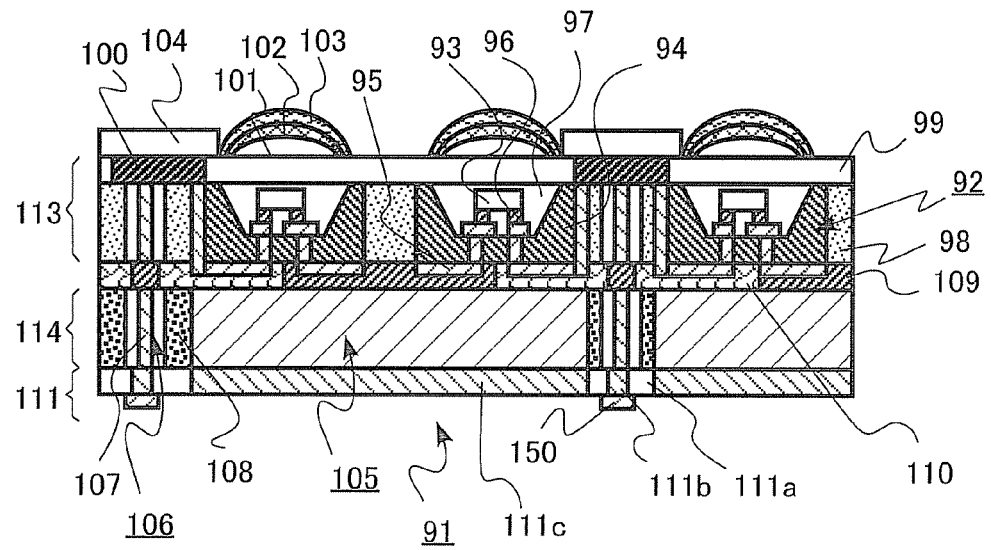
FIG. 9 is a sectional view of a semiconductor device according to a fourth embodiment of the invention.

FIG. 9 is a sectional view of the semiconductor device of the fourth embodiment. In a semiconductor device 91, an LED array module 113 that is of the first chip module and a heat radiation plate module 114 that is of the second chip module are vertically bonded by a bonding layer 110. A global interconnection layer 111 is formed on the side of the heat radiation plate module 114 of the semiconductor device 91 in order to lead the electrode from the LED array module 113.

In the LED array module 113, plural LED chips 92 and connecting chip 106 are bonded by a first resin layer 98. The LED chip 92 includes a reflector substrate 94 in which a recess is provided in a surface, a LED 93 that is mounted in the recess, a resin sealing layer 97, and a bump 96 that electrically connects the LED 93 and a lead electrode 95 that is formed in the reflector substrate 94.

The heat radiation plate module 114 includes a heat radiation metal chip 105 and a connecting chip 106, and the heat radiation metal chip 105 and the connecting chip 106 are bonded by a second resin layer 108.

The LED array module 113 and the heat radiation plate module 114 are electrically connected by a connection electrode 109 located between the modules and an in-chip through via 107 formed in the connecting chip 106. The lead electrode 95 of the LED chip 92 is electrically connected to the connecting chip 106 through a connection via 100 provided in a transparent resin sheet 99. A first planarizing film 104 is formed on the connection via 100.

The LED chip 92 and an electrode pad 150 are electrically connected through the connecting chip 106. The electrode pad 150 is provided in a surface on the opposite side from the LED array module 113 of the heat radiation plate module 114.

In the semiconductor device 91, a lenticular transparent resin layer 101, a color conversion layer 102, and a protective resin layer 103 are also formed on the transparent resin sheet 99 that is formed on the light emitting surface side of the LED device 92.

In the semiconductor device of the fourth embodiment, the heat radiation metal chip 105 is provided in the rear surface to enhance the heat radiation efficiency, which allows the implementation of the high-luminous-efficiency semiconductor device. The semiconductor device of the fourth embodiment is the particularly effective configuration for the semiconductor device in which the control IC chip is not required, for example, the semiconductor device in which the homogeneous LED characteristic is ensured. As with the first to third embodiments, the LEDs can densely be packed on the light emitting surface side by the use of the connecting chip.

A method for manufacturing the semiconductor device of the fourth embodiment will be described below. FIGS. 10A to 10H are process sectional views illustrating the method for manufacturing the semiconductor device of the fourth embodiment.

Figure 10A:
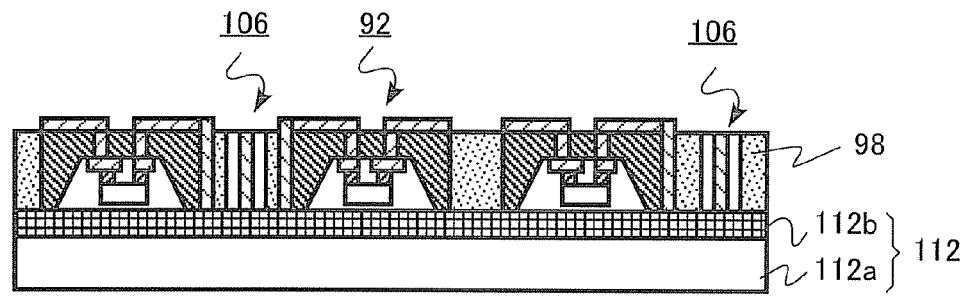
FIGS. 10A to 10H are process sectional views illustrating a method for manufacturing the semiconductor device of the fourth embodiment.

For example, a substrate in which an adhesive film 112b is caused to adhere to a glass substrate 112a is prepared as the support substrate 112 by the method similar to the method for manufacturing the chip module of the first and second embodiments. In the adhesive film 112b, the acrylic adhesive layer is formed in both surfaces of a PET film. The plural LED chips 92 and the connecting chip 106 are tentatively fixed onto the support substrate 112. For example, resin in which a filler is added to anhydride epoxy resin by 85 weight percent is prepared as the first resin film 98, and the filler mainly contains AlN having an average particle diameter of 10 μm. Then, bonding resin is printed in a narrow gap between components by a vacuum printing method (FIG. 10A). The tentative baking is performed at 100° C. for one hour, and the main baking is performed at 160° C. for 30 minutes after the support substrate 112 is removed, thereby forming the LED array module 113 (details are not illustrated).

Figure 10B:
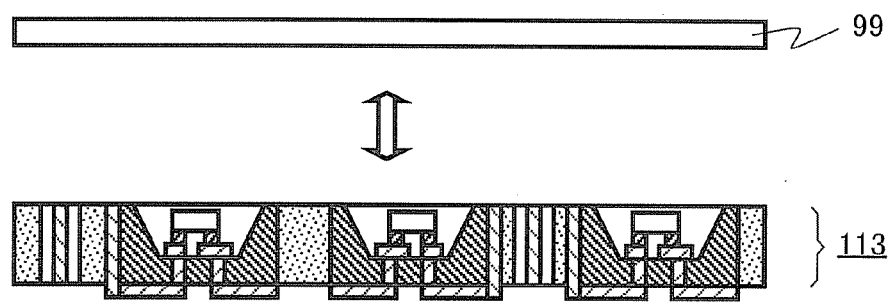
Figure 10C:
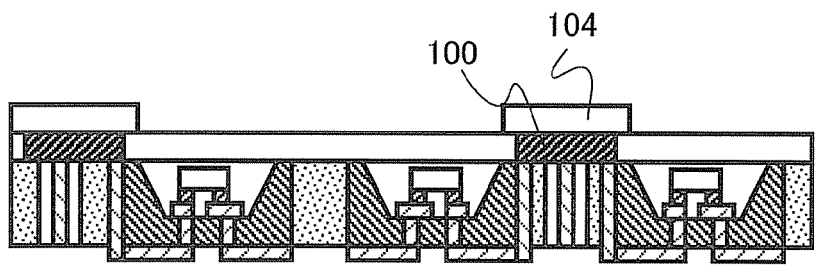

The transparent resin sheet 99 that is of the photosensitive epoxy resin layer is bonded onto the LED array module 113, and an opening is provided through the photolithographic process. Then the silver paste is buried to form the connection via 100. A polyimide resin is applied with the dispenser, and the polyimide resin is burned to form the first planarizing film 104 (FIGS. 10B and 10C).

Figure 10D:
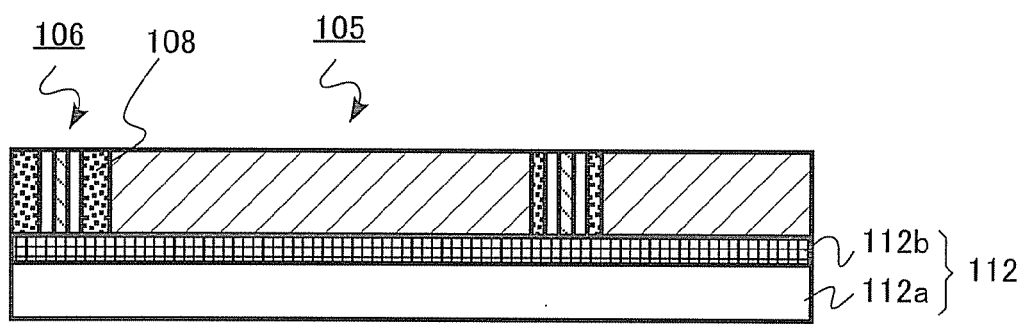

The plural metal chips 105 and the connecting chip 106 are tentatively fixed onto the support substrate 112 through the process similar to the process for manufacturing the LED array module 113. For example, a bonding resin is printed as the second resin film 108 using the resin identical to that of the first resin film in which a filler is added to anhydride epoxy resin by 85 weight percent. The filler mainly contains AlN having an average particle diameter of 10 μm (FIG. 10D). Then, the tentative baking is performed at 100° C. for one hour, and the main baking is performed at 160° C. for 30 minutes after the second resin film 108 is removed from the support substrate 112, thereby forming the heat radiation plate module 114.

Figure 10E:
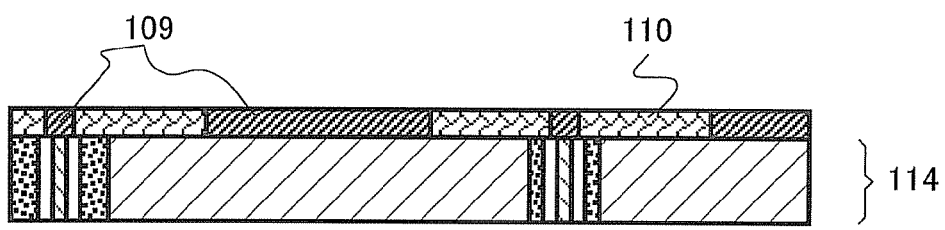
Figure 10F:
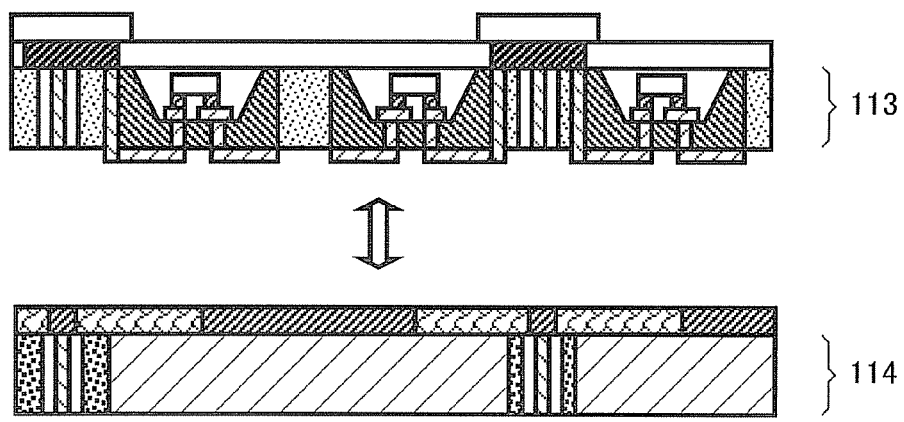
Figure 10G:
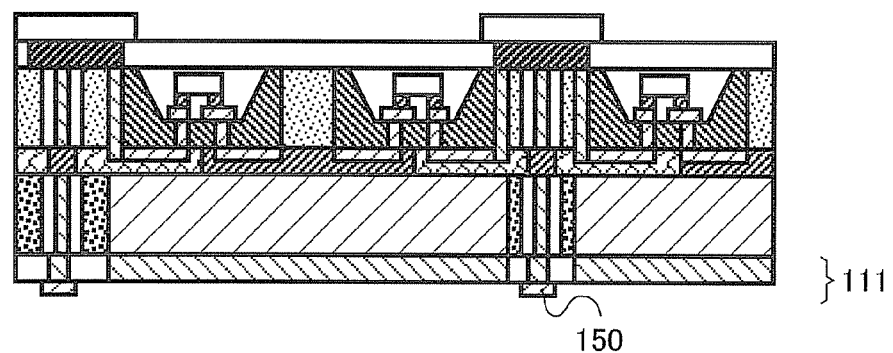
Figure 10H:
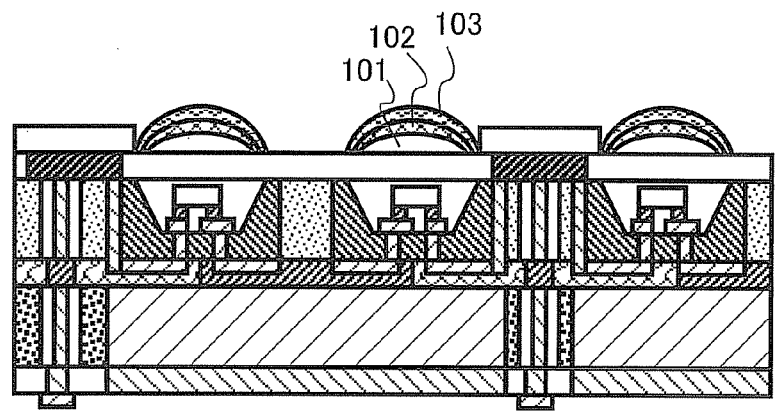

On the heat radiation plate module 114, using the conductive paste, the connection electrodes 109 are formed in a position corresponding to one of the lead electrodes 95 of the LED chip 92 and a position corresponding to the through via 107 in the connecting chip 106, respectively. After the tentative baking, the bonding layer 110 made of resin similar to that of the first resin layer 98 or second resin layer 108 in which the AlN filler is added is printed to another region (FIG. 10E). The heat radiation plate module 114 and the LED array module 113 are bonded, and the connection electrode 109 and the resin layer 110 are cured (FIG. 10F). The global interconnection layer 111 is formed on the side of the heat radiation plate module 114 through the process similar to that of the first to third embodiments.

Then the lenticular silicone transparent resin layer 101, the color conversion layer 102, and the protective resin layer 103 are formed on the transparent resin sheet 99 through the process similar to that of the first and second embodiments.

As illustrated in FIG. 9, the semiconductor device having the high heat radiation characteristic, in which the large-area metal chip 105 is disposed in the lower surface of the LED chip 92 can easily be formed by the manufacturing method of the fourth embodiment.

Fifth Embodiment

A semiconductor device according to a fifth embodiment differs particularly from the semiconductor device of the first embodiment in that the optical element is not the LED chip but an optical MEMS chip.

Figure 11A:
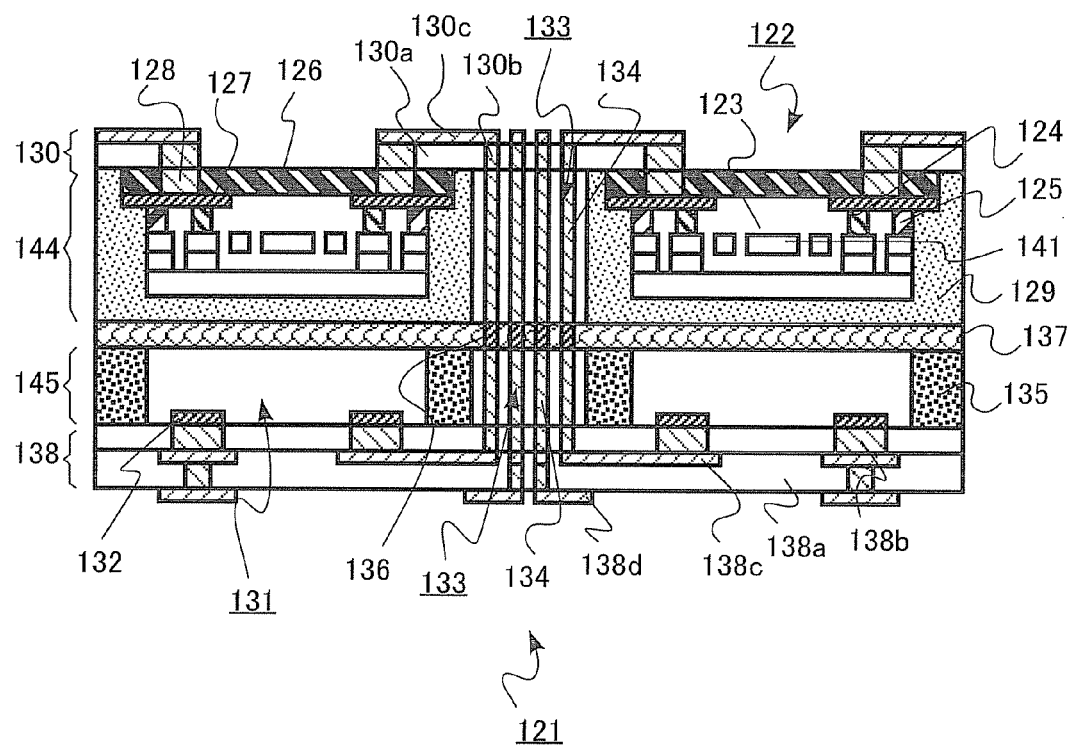
FIGS. 11A and 11B are sectional views of a semiconductor device according to a fifth embodiment of the invention.

FIG. 11A is a sectional view of the semiconductor device of the fifth embodiment.

As illustrated in FIG. 11A, in a semiconductor device 121, a MEMS array module 144 that is of a first chip module and a control circuit module 145 that is of a second chip module are vertically bonded by a bonding layer 137. For the purpose of the electric connection between the elements, a first global interconnection layer 130 is formed on the side of the MEMS array module 144 of the semiconductor device 121, and a second global interconnection layer 138 is formed on the side of the control circuit module 145.

The MEMS array module 144 includes an optical MEMS chip 122 and a connecting chip 133. A recess is provided in a surface of the optical MEMS chip 122, and the optical MEMS chip 122 includes a MEMS unit 123 in which a MEMS movable unit 141 is formed in the recess. A connection bump 124 and a sealing frame 125 are formed in the MEMS unit 123, and a cap 126 of the transparent glass layer is provided to protect the movable unit 141. The MEMS unit 123 is electrically connected to the first global interconnection 130 through a lead interconnection 127 and a connection via 128, which are formed in the cap 126. The MEMS chip 122 and a connecting chip 133 in which a through via 134 piercing therethrough is formed are bonded within the substantially same plane by a first resin layer 129.

The control circuit module 145 includes a control IC chip 131 and the connecting chip 133. The control IC chip 131 includes a connection pad 132 that is located on an upper surface thereof, and the control IC chip 131 and the connecting chip 133 are bonded within the substantially same plane by a second resin layer 135.

The electric connection between the MEMS array module 144 and the control circuit module 145 is secured by the connecting chips 133 in the modules through the connection electrode 136 and the through via 134 piercing through the connecting chip 133. The MEMS array module 144 and the control circuit module 145 are bonded by the bonding layer 137. The optical MEMS chip 122 disposed in one of surfaces of the semiconductor device 121 is connected to the control IC chip 131 by the second global interconnection layer 138 that is formed in the other surface on the side of the control circuit module 145, and the optical MEMS chip 122 is driven by the control IC chip 131.

Figure 11B:
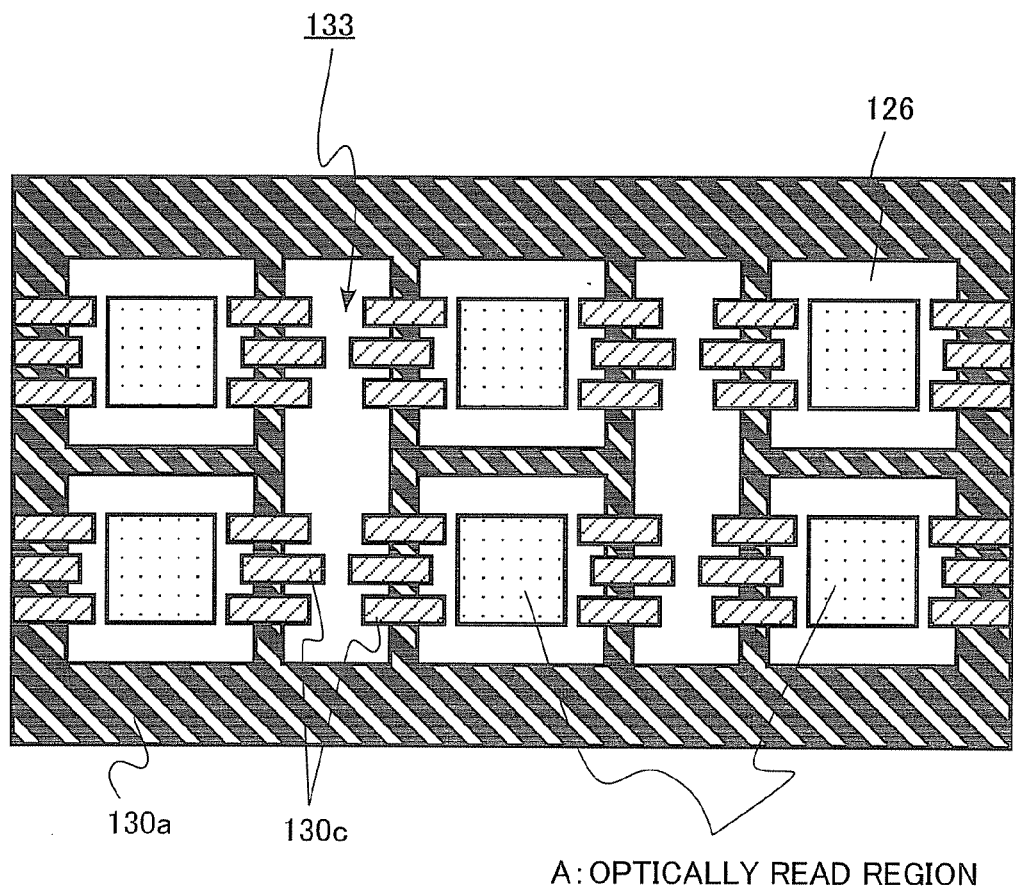

FIG. 11B is a plan view of the semiconductor device of the fifth embodiment. In the semiconductor device 121, optically read regions A corresponding to the movable units 141 of the MEMS units 123 are densely disposed as illustrated in FIG. 11B.

In the semiconductor device 121 of the fifth embodiment, because the control circuit IC chip 131 is disposed on the rear surface side of the MEMS chip 122 using the connecting chip 133, the optically read regions A are densely laid out. Therefore, the excellent semiconductor device 121 is implemented.

A method for manufacturing the semiconductor device of the fifth embodiment will be described below. FIGS. 12A to 12J are process sectional views illustrating the method for manufacturing the semiconductor device of the fifth embodiment.

Figure 12A:
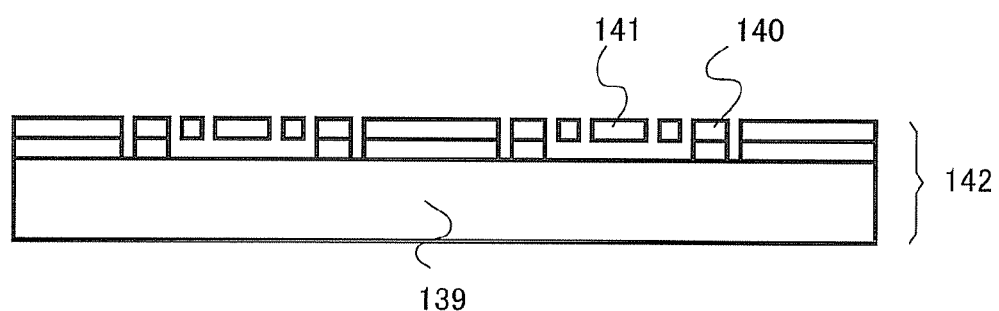
FIGS. 12A to 12J are process sectional views illustrating a method for manufacturing the semiconductor device of the fifth embodiment.

A MEMS substrate 142 in which the movable unit 141 and a fixed electrode 140 are formed is produced on a silicon substrate 139 through the semiconductor manufacturing process (FIG. 12A).

Figure 12B:
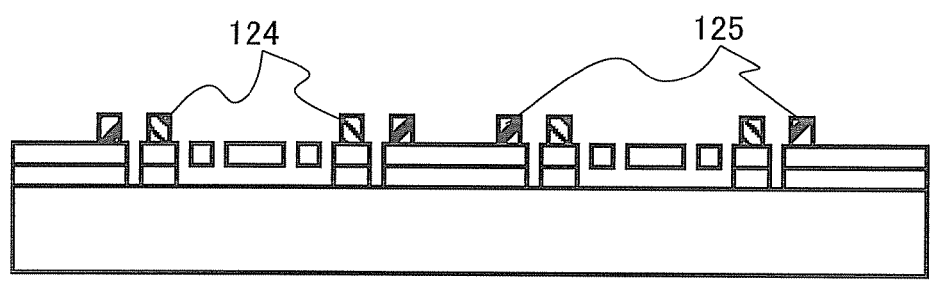
Figure 12C:
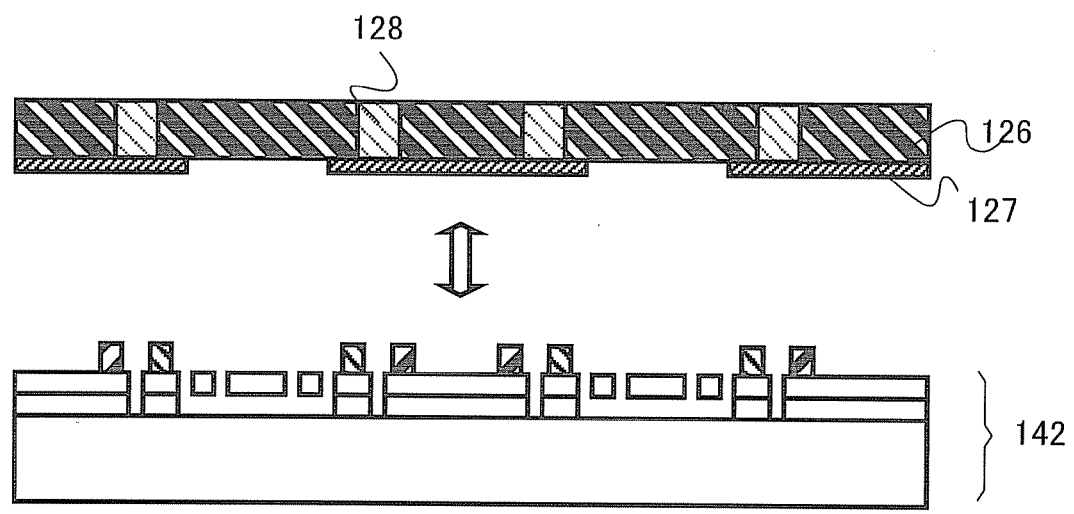

As illustrated in FIG. 12B, after an Au ball bump 124 is formed on the fixed electrode 140, epoxy resin is applied with the dispenser to form the sealing frame 125, and the tentative baking is performed at 80° C. for 10 minutes. After an aluminum interconnection is formed in a glass plate having a thickness of 0.2 mm by the photolithographic method, an opening is provided by the blasting, and the opening is filled with Ag paste to form the connection via 128. Then the glass cap 126 is joined to the MEMS substrate 142 (FIG. 12C).

Figure 12D:
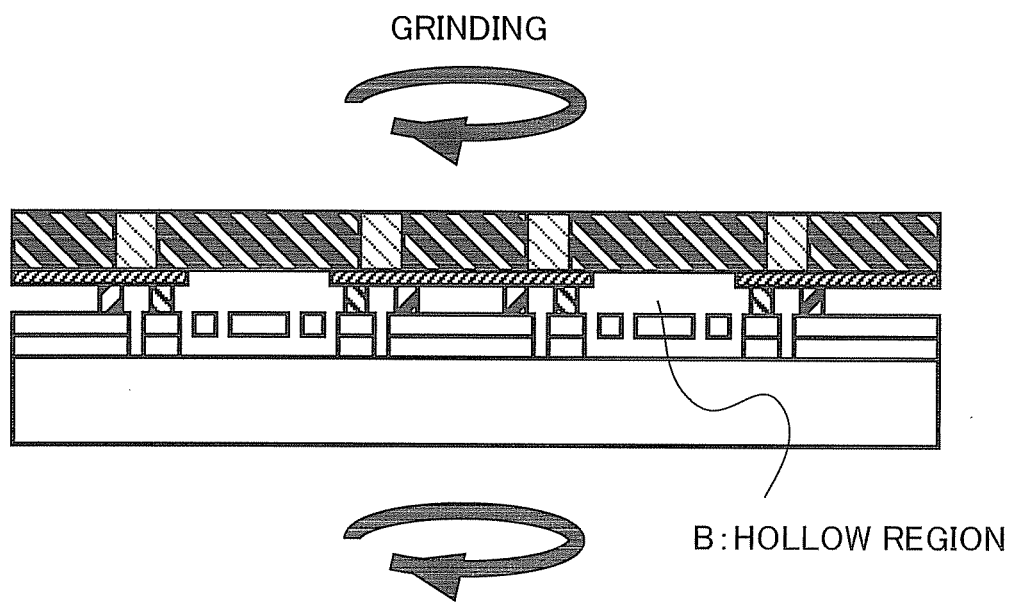
Figure 12E:
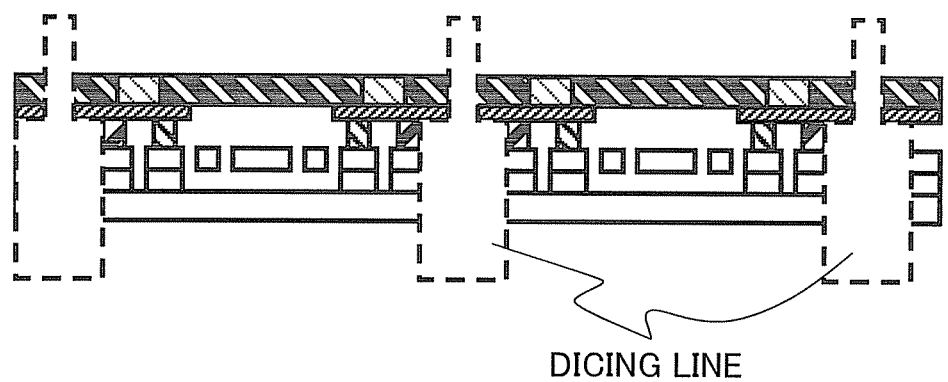

Then, for example, the sealing frame is burned at 150° C. for 30 minutes to produce the capped MEMS substrate 142. The rear surfaces of the glass cap 126 and MEMS substrate 142 are ground to reduce the whole thickness to 0.3 mm (FIG. 12D). Then the glass cap 126 and the MEMS substrate 142 are cut from both surfaces into pieces using blades having different cutting widths, thereby forming the MEMS chip 122 (FIG. 12E).

Figure 12F:
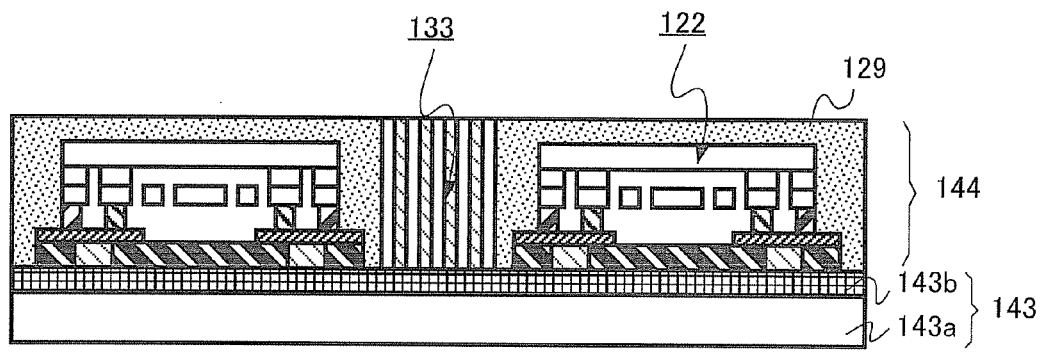

The plural MEMS chips 122 and the connecting chip 133 are tentatively fixed onto the support substrate 143 in which an adhesive layer 143b is formed on a glass substrate 143a. Resin is prepared as the first resin layer 129. In the resin, for example, a filler is added to anhydride epoxy resin by 85 weight percent, and the filler mainly contains silica having an average particle diameter of 10 μm. Then, bonding resin is printed in a narrow gap between components by the vacuum printing method (FIG. 12F). The tentative baking is performed at 100° C. for one hour, and the main baking is performed at 160° C. for 30 minutes after the support substrate 143 is removed, thereby forming the MEMS array module 144.

Figure 12G:
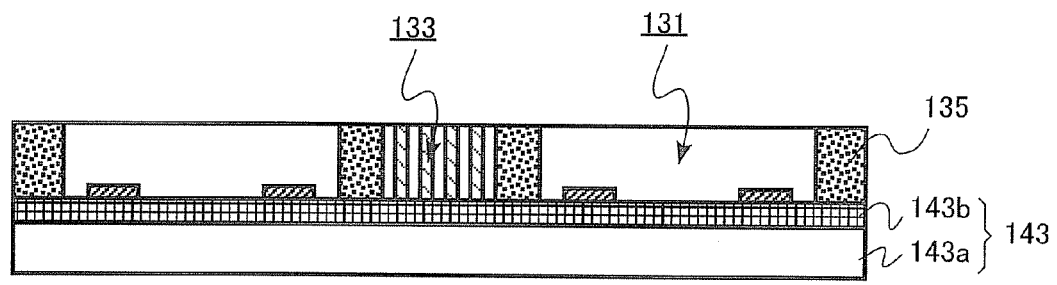

As illustrated in FIG. 12G, the control IC chip 131 and the connecting chip 133 are tentatively fixed onto the support substrate 143, and resin is vacuum-printed to form the second resin layer 135. In the resin, as with the first resin layer 129, a filler is added to anhydride epoxy resin by 85 weight percent, and the filler mainly contains silica having an average particle diameter of 10 μm. After the tentative baking, the support substrate is removed, and the main baking is performed to produce the control circuit module 145.

Figure 12H:
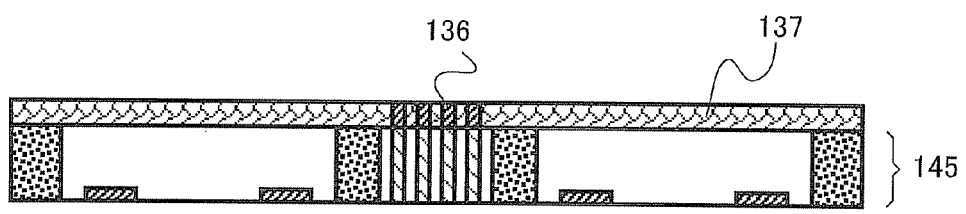
Figure 12I:
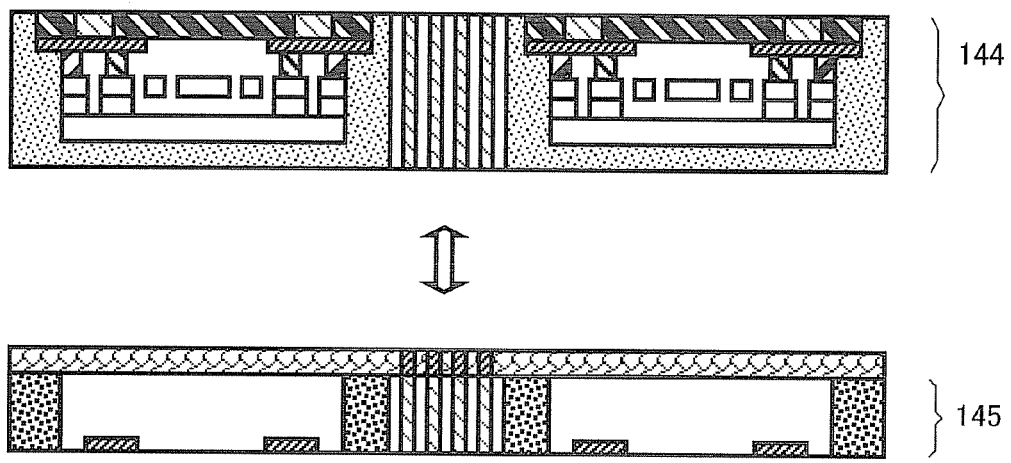

On the control circuit module 145, the connection electrode 136 is formed in a position corresponding to the through via 134 of the connecting chip 133 using the conductive paste. After the tentative baking, the bonding layer 137 is printed in another region. As with the first and second resin layer, the bonding layer 137 is made of the resin in which the silica filler is added by 85 weight percent (FIG. 12H). Then the MEMS array module 144 and the control circuit module 145 are joined to each other (FIG. 12I). The connection electrode 136 and the bonding layer 137 are cured.

Figure 12J:
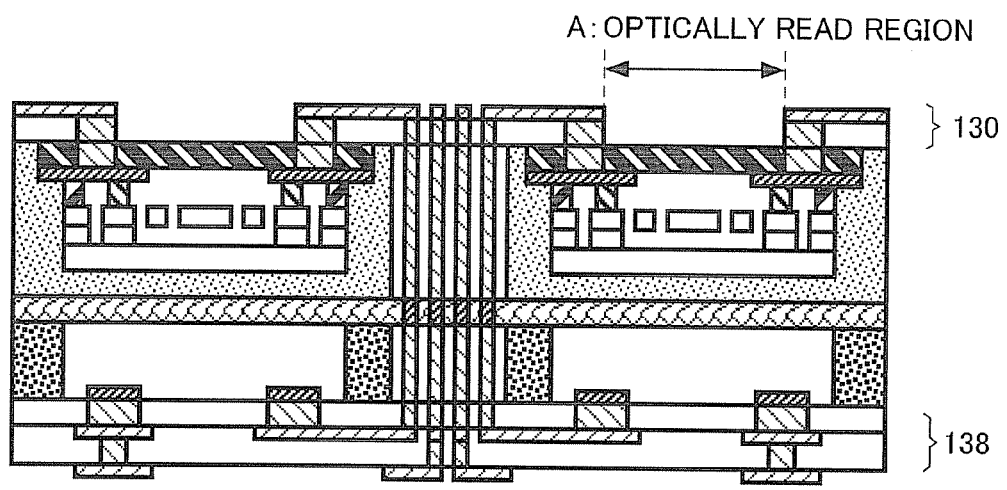

Then, through the manufacturing process similar to that of the first to fourth embodiments, the first global interconnection layer 130 is formed on the side of the MEMS array module 144, and the second global interconnection layer 138 is formed on the side of the control circuit module 145 (FIG. 12J).

The semiconductor device 121, in which the optically read regions A are densely laid out while the cap 126 that protects the movable unit 141 is formed in the MEMS unit including the hollow region B, is obtained by the manufacturing method of the fifth embodiment as illustrated in FIG. 11. Alternatively, before joining both modules, the global interconnection layer 130 and 138 may be formed and both modules may be joined.

The embodiments of the invention are specifically described above. However, the embodiments are cited only by way of example, and the invention is not limited to the embodiments. In the semiconductor device and manufacturing method of the embodiments, the descriptions of portions that are not directly necessary for the description of the invention are omitted. However, constituents concerning the necessary semiconductor device and manufacturing method can appropriately be selected and used.

All the semiconductor devices and manufacturing methods, which include constituent of the invention and can appropriately be changed by those skilled in the art, are included in the scope of the invention. The scope of the invention should be defined by claims and equivalents thereof.

What is claimed is:

1. A semiconductor device comprising:
a first chip module;
a second chip module; and
a bonding layer configured to bond vertically the first chip module and the second chip module,
wherein the first chip module includes a plurality of optical chips, the optical chips are bonded within a substantially same plane, the optical chips are bonded by a first resin layer interposed therebetween, each of the optical chips including an optical element,
the second chip module includes a plurality of control semiconductor chips and a plurality of connecting chips, the control semiconductor chips control the optical chips, the connecting chips include conductive materials piercing through the connecting chips, the control semiconductor chips and the connecting chips being bonded within a substantially same plane, the control semiconductor chips and the connecting chips are bonded by a second resin layer interposed therebetween, the second resin layer is different from the first resin, the optical chips and the control semiconductor chips are electrically connected through the connecting chips, and no chips or no conductive elements other than the optical chips are located in the first resin between the optical chips.

2. The device according to claim 1, wherein the second chip module includes a heat radiation metal chip, the heat radiation metal chip is bonded within a substantially same plane along with the control semiconductor chips and the connecting chips, the second resin layer is interposed between the heat radiation metal chip and the control semiconductor chips and/or the connecting chips.

3. The device according to claim 1, wherein the optical element is a light emitting element.

4. The device according to claim 1, wherein fillers of the second resin layer and the bonding layer mainly contain AlN.

5. The device according to claim 1, wherein the bonding layer includes connection bumps, the connection bumps connect lead electrodes of the optical chips and the conductive materials piercing through the connecting chips.

* * * * *